(12) United States Patent
Mikasa

(10) Patent No.: US 8,841,717 B2
(45) Date of Patent: Sep. 23, 2014

(54) SEMICONDUCTOR DEVICE AND METHOD OF FORMING THE SAME

(75) Inventor: Noriaki Mikasa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 93 days.

(21) Appl. No.: 13/398,275

(22) Filed: Feb. 16, 2012

(65) Prior Publication Data

US 2012/0211815 A1    Aug. 23, 2012

(30) Foreign Application Priority Data

Feb. 18, 2011    (JP) .................................. 2011-033431

(51) Int. Cl.
*H01L 27/108*    (2006.01)
(52) U.S. Cl.
CPC .... *H01L 27/10876* (2013.01); *H01L 27/10888* (2013.01)
USPC ........... 257/306; 257/296; 257/329; 257/331; 257/E27.084; 257/E29.262; 257/E29.345
(58) Field of Classification Search
CPC ................................................. H01L 27/10888

USPC .................. 257/296, 306, 329, 331, E27.084, 257/E29.262, E29.345

See application file for complete search history.

(56) References Cited

U.S. PATENT DOCUMENTS

| 2010/0032743 A1* | 2/2010 | Huang et al. | .................. 257/306 |
| 2010/0258860 A1* | 10/2010 | Kim et al. | ...................... 257/330 |
| 2011/0248336 A1* | 10/2011 | Jin | ................................. 257/330 |

FOREIGN PATENT DOCUMENTS

| JP | 2000-307084 | 11/2000 |
| JP | 2010-147078 | 7/2010 |

* cited by examiner

*Primary Examiner* — Matthew W Such
*Assistant Examiner* — David Spalla
(74) *Attorney, Agent, or Firm* — Young & Thompson

(57) ABSTRACT

In one embodiment, a semiconductor device includes a semiconductor substrate having a first groove; and a plurality of first pillars over the substrate. The plurality of first pillars is disposed beside the first groove. A first insulator is disposed in the first groove. A bit contact is disposed in the first groove and over the first insulator. The bit contact is coupled to side surfaces of the plurality of first pillars.

16 Claims, 40 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2011-33431, filed Feb. 18, 2011, the content of which is incorporated herein by reference.

2. Description of the Related Art

With an increase in the level of integration and the functionality of semiconductor devices in recent years, the interconnection pitch has been further reduced, and the need for reduction in size has been increasing. Accompanying this, problems, which need to be overcome, have occurred.

For example, in a DRAM (dynamic random-access memory), which is one example of a semiconductor device, with a reduction in the interconnection pitch, there has been a reduction in the contact surface area between an active region and a bit line contact in a memory cell, this being accompanied the problem of an increase in the contact resistance.

Japanese Patent Application Publication No. JPA 2010-147078 discloses that in a constitution of an active region that extends in a direction that intersects with bit lines and word lines. There is a prominent reduction in the contact surface area between the active region and the bit line contact.

Japanese Patent Application Publication No. JPA 2000-307084 discloses a method that, in a constitution in which an active region extends in a direction that is parallel to a bit line, forms the active region into a T shape and causes the upper surface of the protruding part of the T to contact with the bit line contact, so as to increase the contact surface area between the active region or an impurity diffusion region and a bit line contact, thereby reducing the contact resistance.

Even the direction of extension of the active region is parallel to the bit line. The protruding part of the active region is formed in a T shape. Thus, it was difficult to achieve a sufficiently high level of DRAM integration.

SUMMARY

In one embodiment, a semiconductor device may include, but is not limited to, a semiconductor substrate having a first groove; a plurality of first pillars over the substrate, the plurality of first pillars being disposed beside the first groove; a first insulator in the first groove; and a bit contact in the first groove and over the first insulator, the bit contact being coupled to side surfaces of the plurality of first pillars.

In another embodiment, a semiconductor device may include, but is not limited to, a semiconductor substrate having a first groove; a plurality of pillars aligned beside the first groove, the plurality of pillars comprising first and second pillars including first and second diffusion regions, respectively; a first insulator in the first groove; a bit contact in the first groove and over the first insulator, the bit contact being coupled to a side surface of the first pillar; and a storage node contact coupled to a top surface of the second pillar.

In still another embodiment, a semiconductor device may include, but is not limited to, a semiconductor substrate having a plurality of first pillars and a plurality of second pillars, the first and second pillars being defined by first and second grooves, the first and second pillars having first and second diffusion regions; a plurality of first insulating films in the first grooves; a plurality of bit contacts in the first grooves and over the plurality of first insulating films, each of the bit contacts being in contact with side surfaces of the first pillars disposed beside the first groove in which the each bit contact is disposed; a plurality of bit lines coupled to the plurality of bit contacts; a plurality of storage node contacts coupled to top surfaces of the plurality of second pillars; a plurality of word lines in the second grooves, the first and second pillars being disposed in opposite sides of the second groove; a plurality of second insulating films in the second grooves and over the word lines; and a plurality of bit lines coupled to the plurality of bit contacts.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1A:
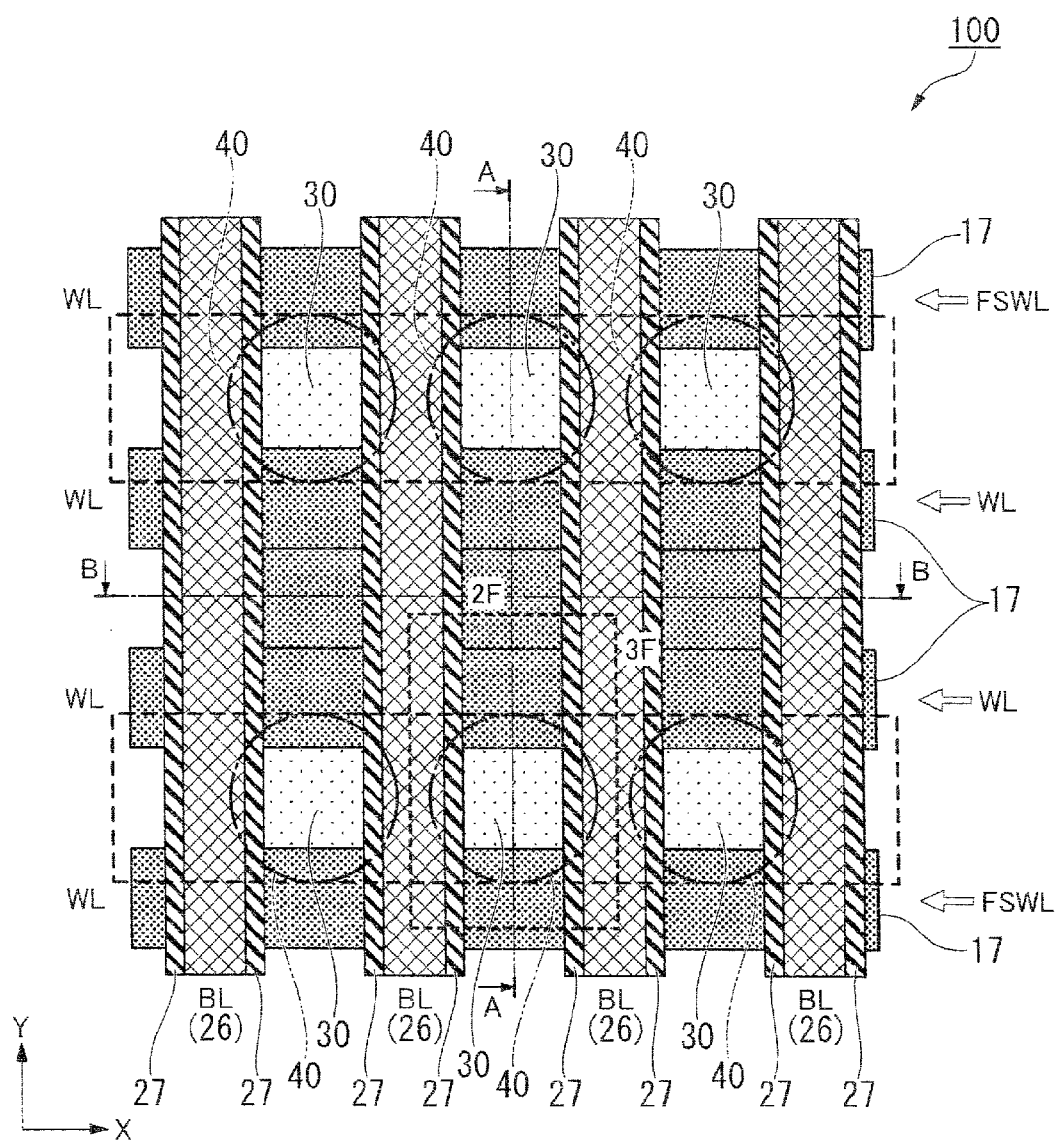
FIG. 1A is a fragmentary plain view of a semiconductor device in accordance with an embodiment of the present invention.

In one embodiment, a semiconductor device may include, but is not limited to, a semiconductor substrate having a first groove; a plurality of first pillars over the substrate, the plurality of first pillars being disposed beside the first groove; a first insulator in the first groove; and a bit contact in the first groove and over the first insulator, the bit contact being coupled to side surfaces of the plurality of first pillars.

In some cases, the semiconductor device may further include, but is not limited to, a plurality of second pillars over the substrate, the plurality of second pillars being disposed beside the first groove; and a plurality of storage node contacts coupled to top surfaces of the plurality of second pillars.

In some cases, the semiconductor device may include, but is not limited to, a second insulator covering a top of each of the plurality of first pillars.

In some cases, the semiconductor device may further include, but is not limited to, a bit line coupled to the bit contact.

In some cases, the semiconductor device may further include, but is not limited to, a word line in a second groove of the semiconductor substrate; and a third insulator in the second groove and over the word line. The first and second pillars are disposed in opposite sides of the second groove.

In another embodiment, a semiconductor device may include, but is not limited to, a semiconductor substrate having a first groove; a plurality of pillars aligned beside the first groove, the plurality of pillars comprising first and second pillars including first and second diffusion regions, respectively; a first insulator in the first groove; a bit contact in the first groove and over the first insulator, the bit contact being coupled to a side surface of the first pillar; and a storage node contact coupled to a top surface of the second pillar.

In some cases, the bit contact is in contact with the side surface of the first pillar.

In some cases, the plurality of pillars further may include, but is not limited to, a third pillar including the first diffusion region. The bit contact contacts with side surfaces of the first and third pillars to connect the first and third pillars.

In some cases, the semiconductor device may further include, but is not limited to, a second insulator covering a top of each of the plurality of first pillars.

In some cases, the semiconductor device may further include, but is not limited to, a bit line coupled to the bit contact.

In some cases, the semiconductor device may further include, but is not limited to, a word line in a second groove of the semiconductor substrate; and a third insulator in the second groove and over the word line. The first and second pillars are disposed in opposite sides of the second groove.

In some cases, the third insulator has first and second side surfaces opposite to each other, the first side surface facing to the first diffusion region and the second side surface facing to the second diffusion region.

In some cases, a top of the word line is deeper than a bottom of the bit contact.

In some cases, a top of the word line is deeper than bottoms of the first and second diffusion regions.

In some cases, a bottom of the first diffusion region is deeper than a bottom of the second diffusion region.

In some cases, the semiconductor device may further include, but is not limited to, a fourth insulator in the first groove and over the first insulator, the fourth insulator being disposed in an opposite side of the bit contact to the side surface of the first diffusion region.

In still another embodiment, a semiconductor device may include, but is not limited to, a semiconductor substrate having a plurality of first pillars and a plurality of second pillars, the first and second pillars being defined by first and second grooves, the first and second pillars having first and second diffusion regions; a plurality of first insulating films in the first grooves; a plurality of bit contacts in the first grooves and over the plurality of first insulating films, each of the bit contacts being in contact with side surfaces of the first pillars disposed beside the first groove in which the each bit contact is disposed; a plurality of bit lines coupled to the plurality of bit contacts; a plurality of storage node contacts coupled to top surfaces of the plurality of second pillars; a plurality of word lines in the second grooves, the first and second pillars being disposed in opposite sides of the second groove; a plurality of second insulating films in the second grooves and over the word lines; and a plurality of bit lines coupled to the plurality of bit contacts.

In some cases, the semiconductor device may further include, but is not limited to, a plurality of third insulating films in the first grooves and over the first insulating films, each of the third insulating films being disposed in an opposite side of the bit contact to the side surface of the first diffusion region.

In some cases, the semiconductor device may further include, but is not limited to, a plurality of capacitors coupled to the plurality of storage node contacts.

In some cases, the semiconductor device may further include, but is not limited to, a plurality of fourth insulating films covering tops of the plurality of first pillars.

In an embodiment, the active regions arranged linearly are parallel to the bit lines arranged linearly, and in which an electrical contact is made by the bit line contacts making contact with the side surface of the impurity diffusion regions at the top part of the semiconductor pillars in an active region, the need to form the active regions into a T shape to form bit line contacts as is conventionally done is eliminated, thereby enabling the achievement of a size reduction of the memory cell. Also, because the constitution is such that a contact is formed on the side wall of the active region, it is possible to increase the contact surface area between the active region (impurity diffusion region) and the bit line contact, thereby enabling a reduction in the contact resistance, without increasing the plan-view surface area of the active region. In the present embodiment, the word line that becomes the transistor gate electrode is buried in a trench and does not protrude above the semiconductor substrate surface.

Additionally, the bit lines extend in a direction that is parallel to the active regions. The bit lines do not traverse across the active regions. Even in a microfine configuration, it is possible to achieve the maximum surface area of the upper surface of the active region, which serves as the storage node contact, thereby enabling a reduction of the storage node contact resistance.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

Embodiments

A semiconductor device and a method for manufacturing the semiconductor device, which are aspects to which the present embodiment is applied, are described below, with references made to the drawings where appropriate. In these aspects, the description uses a DRAM (dynamic random-access memory) as an example of the semiconductor device. The drawings referred to in the following descriptions are for the purpose of describing the method for manufacturing the semiconductor device of the present aspects, and the sizes, thicknesses, and dimensions and the like of the various parts that are illustrated may be different from the dimensional relationships in an actual semiconductor device. The materials, and dimensions and the like given as examples in the following descriptions are examples, and the present embodiment is not necessarily restricted thereto, and may be embodied by various appropriate changes, within the scope of the spirit of the present embodiment.

In the following aspects, although embodiments will also be described, the specifically indicated materials, dimensions, and the like are merely examples.

First, the structure of a semiconductor memory device (DRAM) shown in FIG. 1A to FIG. 1C, which is an example of a semiconductor device to which the present embodiment is applied, will be described. The illustrated structure shows a part of the semiconductor device.

FIG. 1A is a drawing showing the plan-view layout of a part of the semiconductor device 100. A part of the internal structure is also shown. FIG. 1B is a cross-sectional view showing the semiconductor device 100 along the cutting line A-A shown in FIG. 1A, and FIG. 1C is a cross-sectional view of the semiconductor device 100 along the cutting line B-B in FIG. 1A.

The semiconductor device 100 is ultimately caused to function as a DRAM, each memory cell having a MOS transistor having source or drain regions (impurity diffusion regions) 23a and 23b, a gate electrode (word line) 17, and a capacitor 40.

Figure 1B:
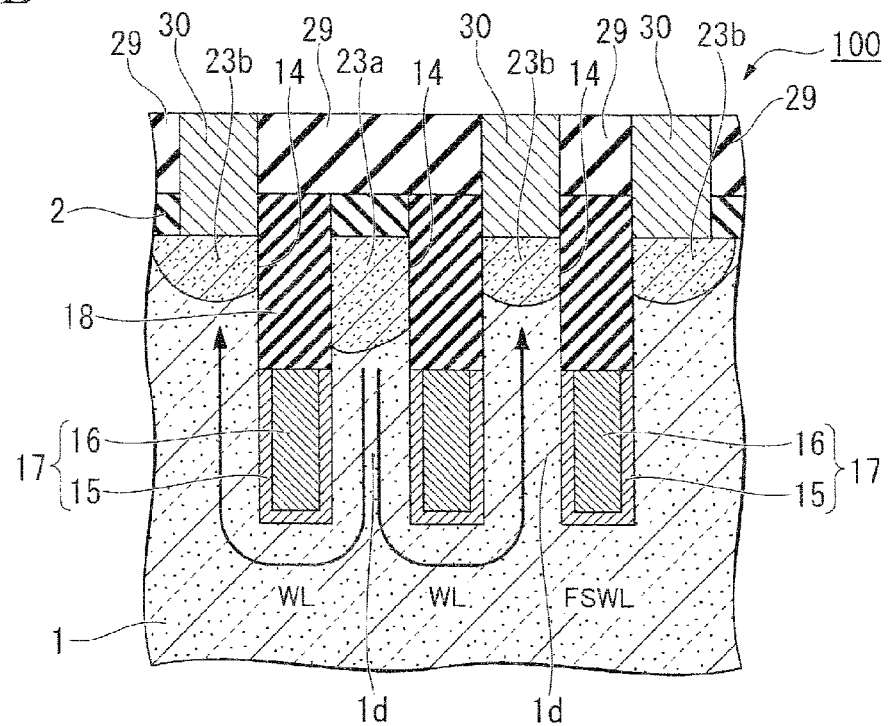
FIG. 1B is a fragmentary cross sectional elevation view, taken along an A-A line of FIG. 1A, of the semiconductor device in accordance with the embodiment of the present invention.

Although the position of the capacitor 40 is shown in FIG. 1A, this is omitted from FIG. 1B.

The semiconductor device (DRAM) 100 described as this aspect, as shown in FIG. 1A, has a $6F^2$ ($2F \times 3F$) cell arrangement (where F is the minimum process dimension).

The semiconductor device 100 has a plurality of isolation trenches (first trenches) 4 that are formed on the main surface of a semiconductor substrate 1 and that extend linearly in the y direction (first direction); isolation regions (second insulating layers) 6 that are formed to bury the lower parts of the isolation trenches 4; a plurality of word line formation trenches (second trenches) 14 that are formed on the main surface of the semiconductor substrate 1 and that extend linearly in the x direction (second direction) that is perpendicular to the y direction; word lines 17 that bury the lower parts of the word line formation trenches 14 and that are formed inside the word line formation trenches 14 with intervening gate electrode films (fifth insulating films, not shown) on the inner walls of the word line formation trenches 14; a plurality of semiconductor pillars 1d that are formed by partitioned within the semiconductor substrate 1 by the isolation trenches 4 and the word line formation trenches 14 and that are erected perpendicularly with respect to the main surface of the semiconductor substrate 1 and that have impurity diffusion regions 23 at the upper parts thereof; bit line contacts 22a formed on the isolation regions 6 and that are electrically connected to impurity diffusion regions 23a via the side walls of the upper parts of every third semiconductor pillar 1d (each third one) arranged in the y direction; and bit lines 26 that extend linearly in the y direction and that are electrically connected to the bit line contacts 22a.

The above-described semiconductor pillars 1d every third one arranged in the y direction will now be described.

Referring to FIG. 1A, four WLs (word lines 17) are arranged with a uniform pitch in the y direction. As indicated at the right side of the drawing, the word lines disposed at the top and bottom are FSWLs (field shield word lines), provided as isolation regions to electrically separate the active regions that extend in the y direction. The two word lines that are sandwiched between the two field shield world lines at the top and the bottom function as the gate electrodes and the word lines of the transistors. The field shield word lines have the same constitution as the word lines, but do not function as the gate electrodes and word lines of the transistors. The field shield word lines are so-called dummy word lines. A bit line contact is formed so as to make contact with the side surface of the semiconductor pillar 1d (the semiconductor pillar positioned in the top-to-bottom center in FIG. 1A) sandwiched between two word lines. In a DRAM memory cell, the three word lines of WL, WL, and FSWL in FIG. 1A form one unit, which is repeated in the y direction. Specifically, the arrangement is in the sequence WL, WL, FSWL, WL, WL, FSWL. The semiconductor pillar is positioned between each word line and field shield word line. Because the bit line contacts are formed with respect to the semiconductor pillars between word lines, the semiconductor pillars 1d with the bit line contacts formed thereon appear at a rate of one in three of the semiconductor pillars in the y direction.

The semiconductor device 100 has, at semiconductor pillars other than the above-noted plurality of semiconductor pillars 1d that have impurity diffusion regions 23a at the upper part, storage node contacts 30 that are electrically connected to the impurity diffusion regions 23b via the upper surface thereof, and capacitors 40 electrically connected to the storage node contacts 30.

In this aspect, although the constitution is such that the bit line contact 22a is electrically connected to the impurity diffusion region 23b via the side surface of the upper part every third (at each third) semiconductor pillar 1d, another number can be adopted.

The semiconductor substrate 1 is a substrate containing an impurity of a prescribed concentration, for example, p-type single-crystal silicon substrate, in which case, of the surface of the semiconductor substrate 1 the isolation region 6 that is formed by burying the second insulating layer at the lower part of an isolation trench (first trench) 4 has a structure that is referred to as STI (shallow trench isolation), and an element formation region is an active region that is insulated and separated by this isolation region (second insulating layer) 6. Therefore, the active region is sandwiched between each of the isolation regions 6 extending in the y direction, and is constituted by the semiconductor substrate 1 extending in the y direction, the same as the isolation regions 6. The depth of the isolation trench (first trench) 4 is formed to be 1.3 to 2.0 times the depth of the word line formation trenches (second trenches) 14, and is preferably 1.6 times that depth.

In the embodiments described as a method for manufacturing a semiconductor device according to the present embodiment, the description is for the case of using a semiconductor substrate 1 that is a p-type silicon substrate.

At each of the element formation regions, a plurality of semiconductor pillars 1d are arranged as a matrix in directions that are parallel respectively to the x direction (second direction) and to the y direction (first direction), and that are erect in a direction that is perpendicular with respect to the main surface of the semiconductor substrate 1. The impurity diffusion regions 23 (23a, 23b) are formed at the upper part of the semiconductor pillars 1d.

The impurity diffusion regions have the impurity diffusion region 23a connecting to the bit line contact 22a and the impurity diffusion region 23b connecting to the storage node contact 30.

The semiconductor substrate 1 has word line formation trenches (second trenches) 14 that are formed after the formation of the isolation regions (second insulating layers) 6 and element formation regions 1a (refer to FIG. 2C) and that extend linearly in the x direction, which is a direction intersecting the element formation regions 1a.

The word lines 17 are buried into the bottom part of the word line formation trenches (second trenches) 14, and sixth insulating films 18 are formed thereover.

The word lines 17 are word lines (WLs) having the function of actually causing a transistor to operate, and field shield word lines (FSWLs) having the function of isolation, without having the function of causing transistor operation.

That is, although the buried word line (WL) and the element-separating buried word line (FSWL) have the same structure, their functions are different. In this case, whereas the buried word line WL is used as the gate electrode in a memory cell, the element-separating word line FSWL is provided for the purpose of applying a prescribed electrical potential and separating adjacent transistors. That is, by maintaining the element-separating buried word line FSWL at the prescribed electrical potential, it is possible to separate adjacent transistors on one and the same active region by placing the parasitic transistor in the off state.

The semiconductor device 100 has the bit lines (BL) 26 extending linearly in the y direction that is perpendicular to the x direction. The bit lines (BL) 26 are electrically connected to the impurity diffusion region 23a at the upper part of the semiconductor pillars 1d, via the bit line contacts 22a.

The bit lines (BL) 26 have a structure that is the lamination of a polysilicon layer 24 which is doped with an impurity and a W/WN film (metal film) 25 by the sequential deposition of a tungsten nitride (WN) film and a tungsten (W) film. The side surface of the bit lines (BL) 26 is covered by a side wall insulating film 27 made of a silicon nitride film. An insulating film 29 made of a silicon oxide film and used as a mask for forming the storage node contact 30 is buried between the side wall insulating films 27 that cover the side surfaces of adjacent bit lines (BL) 26. The storage node contacts 30 that are adjacent to bit lines (BL) 26 are mutually insulated via the side wall insulating films 27 that are formed on the side wall of the bit line.

Figure 1C:
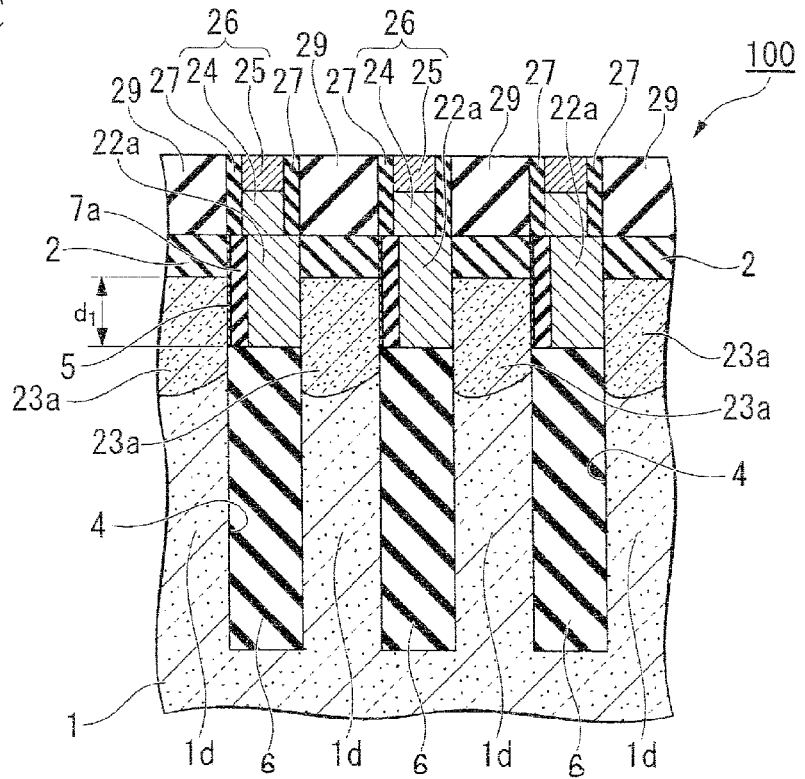
FIG. 1C is a fragmentary cross sectional elevation view, taken along a B-B line of FIG. 1A, of the semiconductor device in accordance with the embodiment of the present invention.

Referring to FIG. 1C, a plurality of semiconductor pillars 1d connected to the bit line contacts 22a are disposed with a uniform pitch in the second direction (x direction). A first trench 4 that becomes an x-direction isolation region is provided between each of the semiconductor pillars 1d. Seen from a different viewpoint, each semiconductor pillar 1d is provided so as to make contact with the both sides of the first trench 4. An isolation insulating film 6 is buried in the bottom part of the first trench 4. The bit line contact 22a is provided over the isolation insulating film 6. The bit line contact 22a is provided so as to make contact with the side surface of the upper parts of the semiconductor pillar that includes the surface of one of the semiconductor pillars 1d adjacent to the first trench 4 on both sides. With respect to the other semiconductor pillar 1d, insulation is provided by a side wall insulating film (third insulating film) 7a formed on the side surface of the semiconductor pillar with an intervening oxide film 5. A first insulating film 2 is provided on the upper surface of each of the semiconductor pillars 1d. The bit line contact plug 22a is provided so as to bury a trench that is constituted with the upper surface of the isolation insulating film 6 as the bottom surface thereof; the side surface of the connected-side semiconductor pillar and the first insulating film 2 as one of the side walls; and the other side wall as the opposing side wall insulating film 7a. By doing this, the bit line contact 22a is connected to the upper part side surface of the semiconductor pillar 1d. The upper surface of the bit line contact 22a is flush with the upper surface of the first insulating film 2 provided above the upper surface of each of the semiconductor pillars.

The plurality of bit line contacts 22a are positioned between each of the active regions (semiconductor pillars 1d) that extend in the first direction, and the bit line 26 is provided, extending in the first direction, which connects to the upper surface of each of the bit line contacts 22a. The bit lines 26, therefore, are positioned between active regions that are straight lines, and are straight lines that extend in the first direction, which is parallel to the active regions.

The bottom surfaces of the bit line contacts 22a are preferably provided so that they are positioned to be shallower than the upper surface of the buried word lines 17, that is, so that they are positioned closer to the semiconductor substrate surface side than the upper surface of the buried word line 17.

As described above, in the semiconductor device of the present embodiment, the semiconductor pillars 1d having the impurity diffusion region 23 at the upper part thereof are partitioned by the isolation trenches (first trenches) 4, the isolation regions (second insulating layers) 6 being formed by burying the bottom part of these first trenches 4, and the bit line contacts 22a are formed over these isolation regions 6 to a thickness that buries the isolation trenches (first trenches) 4.

By adopting this constitution, because the bit line contacts 22a make contact with the side walls of the impurity diffusion region 23, by establishing the appropriate thickness (depth) d1 (FIG. 1C) of the bit line contacts 22a that bury the isolation trenches (first trenches) 4, it is possible to increase the contact surface area between the bit line contacts 22a and the impurity diffusion regions 23, so as to lower the contact resistance.

The thickness (depth) d1 of the bit line contacts 22a that are buried into the isolation trenches (first trenches) 4 is desirably set so as to be approximately 25 nm from the main surface of the semiconductor substrate 1.

Because the constitution is such that the bit lines 26 extend in parallel with the active regions 23 (23a, 23b), the bit lines 26 do not traverse across the active regions 23 (23a, 23b). Therefore, even in a microfine state, it is possible to adopt a constitution in which there is no overlap between the upper surface of the active region 23b that makes contact with the storage node contact 30 and the bit line 26 and bit line side wall insulating film 27, and it is possible to achieve the maximum contact surface area of the upper surface of the active region 23b making contact with the storage node contact 30, and reduce the resistance of the storage node contact.

Additionally, although, as shown in FIG. 1C, the constitution in the present embodiment is two layers, the bit line polysilicon layer 24 and the metal layer 25, the constitution may omit the polysilicon layer 24 that is the underlayer so as to be just the metal layer 25. If that constitution is adopted, the height of the bit line itself can be reduced, this having the effect of simplifying the processing of the structure formed over the bit line.

Although many memory cells are actually formed in an arrangement in an element formation region, in the semiconductor device 100 shown in FIG. 1A to FIG. 1C, because of the difficulty of showing all of these memory cells, as a convenience a schematic representation is used, in which the number of memory cells in the element formation region is reduced.

To describe an example of the operation of the semiconductor device 100 such as described above, as indicated schematically by the arrow in FIG. 1B, a current that has flowed from the bit line 26 to the bit line contact 22a flows from the bit line contact 22a to the impurity diffusion region 23a, via the side surface at the upper part of the semiconductor pillar 1d, flows in the direction of the arrow through the channel formed along the side surface of the word line 17, and to the impurity diffusion region 23b at the upper part of the adjacent semiconductor pillar 1d, and further flows into the capacitor 40 via the storage node contact 30, so that an electrical charge is stored in the capacitor 40.

(Method for Manufacturing the Semiconductor Device)

Next, the method for manufacturing a semiconductor memory device (DRAM), which is an example of a semiconductor device to which the present embodiment is applied, will be described, with references made to FIG. 2 to FIG. 20.

Each of the A-suffixed drawings of FIG. 2A to FIG. 20A are plan-view layouts at the various manufacturing process steps. Each of the B-suffixed drawings of FIG. 2B to FIG. 20B is a cross-sectional view along the cutting line A-A in the corresponding A-suffixed drawings of FIG. 2A to FIG. 2A, and each of the C-suffixed drawings of FIG. 2C to FIG. 20C is a cross-sectional view along the cutting line B-B in the corresponding A-suffixed drawings of FIG. 2A to FIG. 20A.

In the description to follow, parts that are the same as in the semiconductor device 100 are assigned the same reference numerals in the drawings and the descriptions thereof will be omitted.

(Isolation Trench Formation Process)

Figure 2A:
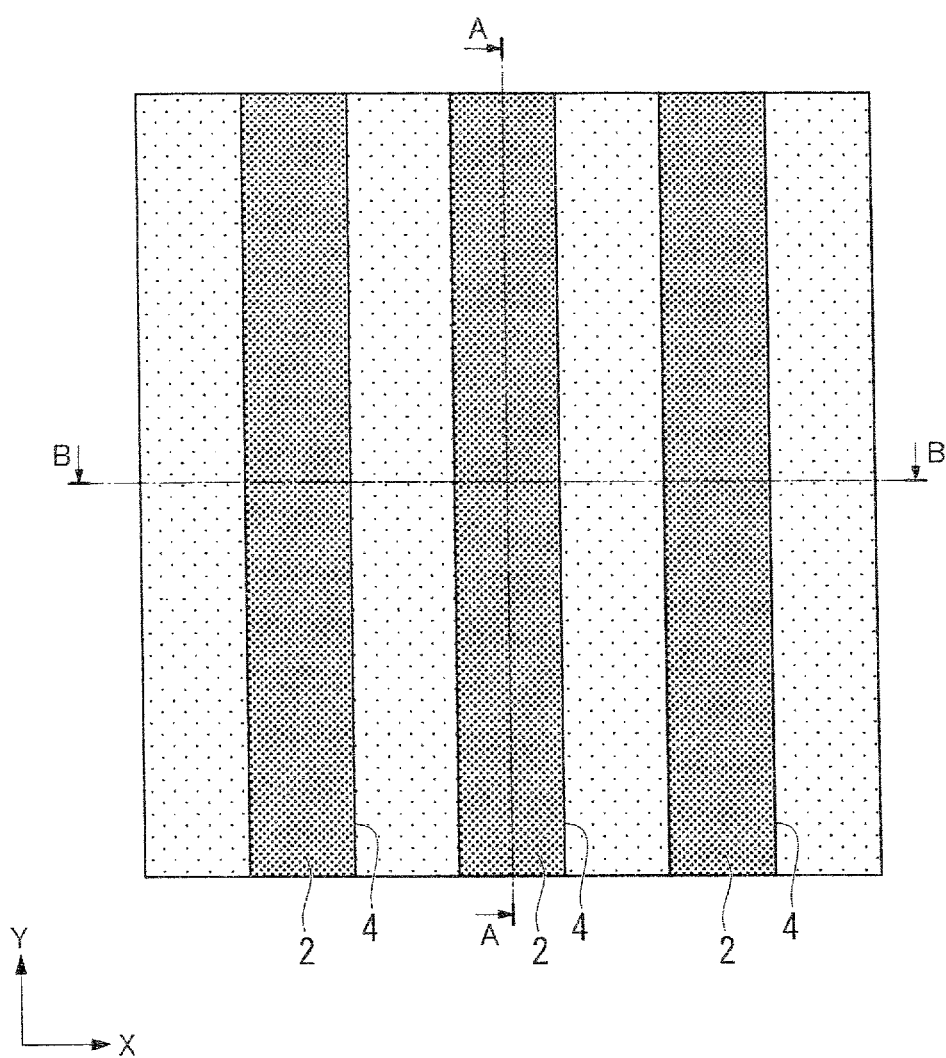
FIG. 2A is a fragmentary plain view of a step involved in a method of forming the semiconductor device of FIGS. 1A, 1B and 1C, in accordance with the embodiment of the present invention.
Figure 2B:
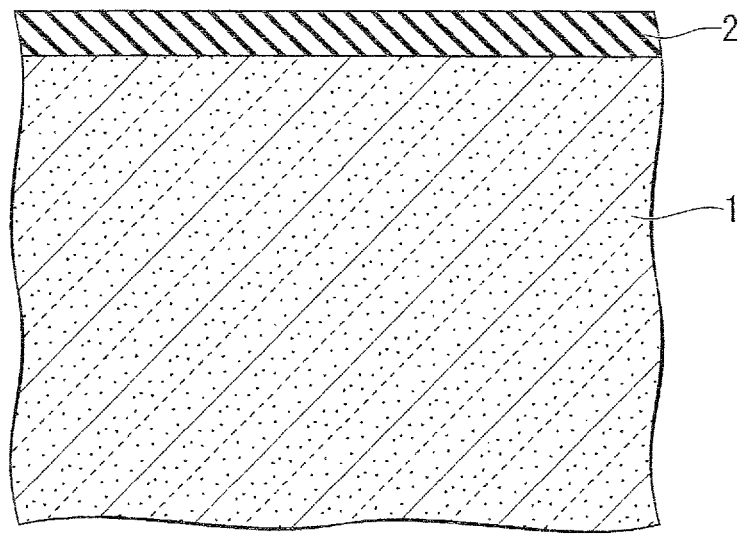
FIG. 2B is a fragmentary cross sectional elevation view, taken along an A-A line of FIG. 2A.
Figure 2C:
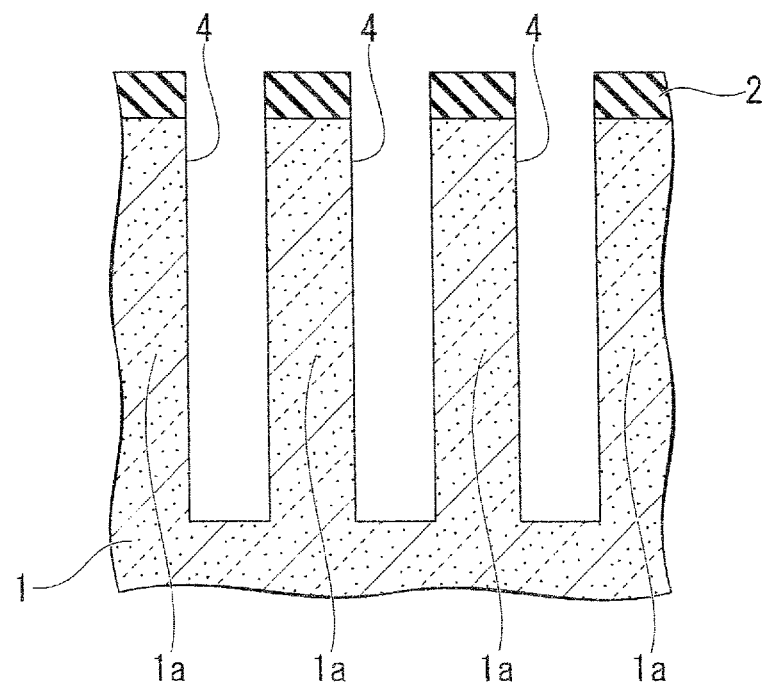
FIG. 2C is a fragmentary cross sectional elevation view, taken along a B-B line of FIG. 2A.

As shown in FIG. 2A to FIG. 2C, the plurality of isolation trenches (first trenches) 4 extending linearly in the y direction (first direction) are formed in the semiconductor substrate 1 surface using the first insulating film 2 and separated in the x direction (second direction), thereby forming element formation regions 1a between adjacent isolation trenches 4. The isolation trenches 4 serve as isolation regions by burying the isolation trenches, and the element formation regions 1a formed between adjacent isolation regions become element formation regions. In this case, the isolation region is what is called an STI structure, and the element formation region is an active region insulated and separated by the isolation region.

To provide isolation trenches 4 in the semiconductor substrate 1, the insulating film (first insulating film) 2 for use as a mask is deposited on the semiconductor substrate 1 and, using photolithography and dry etching, the patterning of the masking insulating film 2 and the semiconductor substrate 1 is performed successively, so as to form the isolation trench (first trench) 4 for partitioning the element formation regions 1a (or active regions) on the semiconductor substrate 1.

The isolation trenches (first trenches) 4 are not only locations that are sandwiched by the element formation regions 1a, but also are locations that are sandwiched by the masking insulating film (first insulating film) 2 formed on the element formation regions 1a.

Specifically, for example, CVD is used to deposit a masking silicon nitride film (first insulating film) 2 on the semiconductor substrate 1, which is made of a p-type silicon substrate, and photolithography and dry etching are used to perform successive patterning of the silicon nitride film 2 and the semiconductor substrate 1, so as to form the STI isolation trenches 4 for partitioning active regions 1a in the semiconductor substrate 1. The active regions 1a partitioned by the STI isolation trenches are made of the element formation regions. The regions that become the active regions 1a, as shown in FIG. 2A to FIG. 2C, are covered by the masking silicon nitride film 2.

(Isolation Trench Filling Process)

Figure 3A:
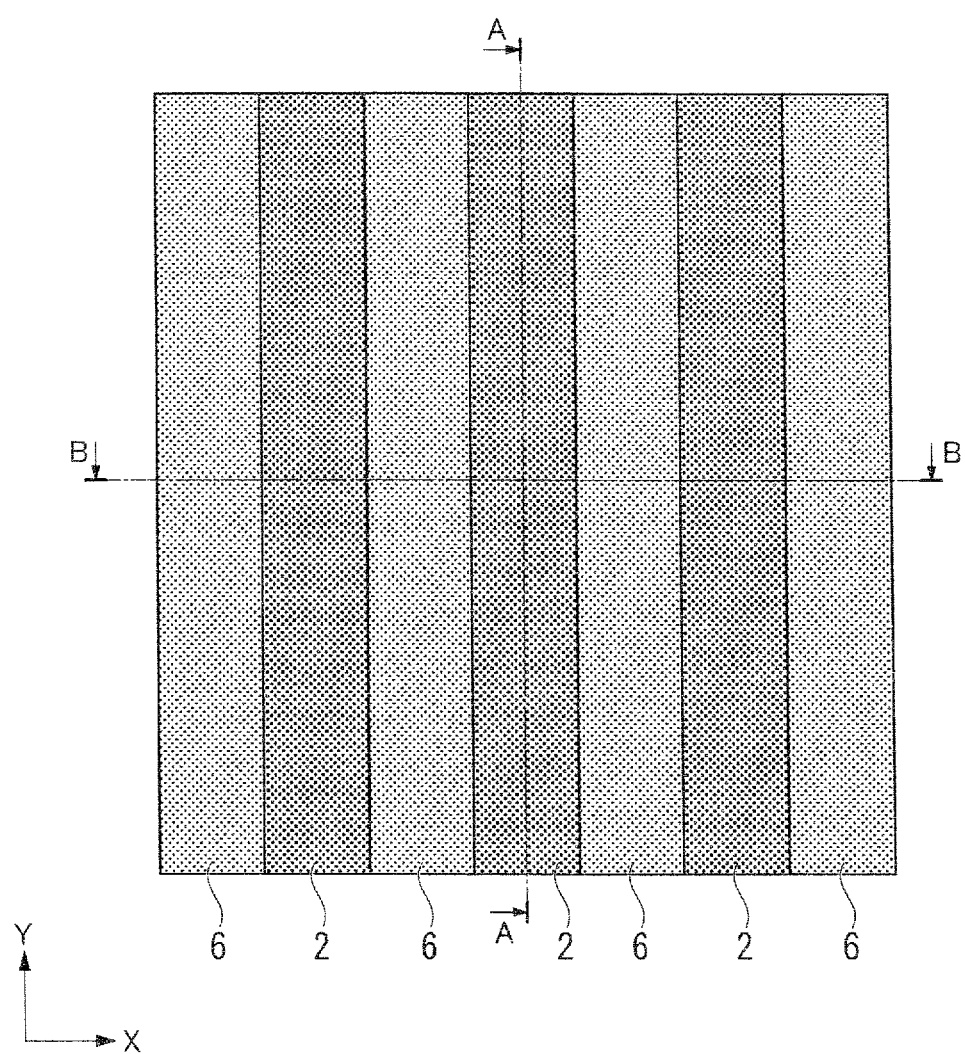
FIG. 3A is a fragmentary plain view of a step, subsequent to the step of FIGS. 2A, 2B, and 2C, involved in the method of forming the semiconductor device of FIGS. 1A, 1B and 1C, in accordance with the embodiment of the present invention.
Figure 3B:
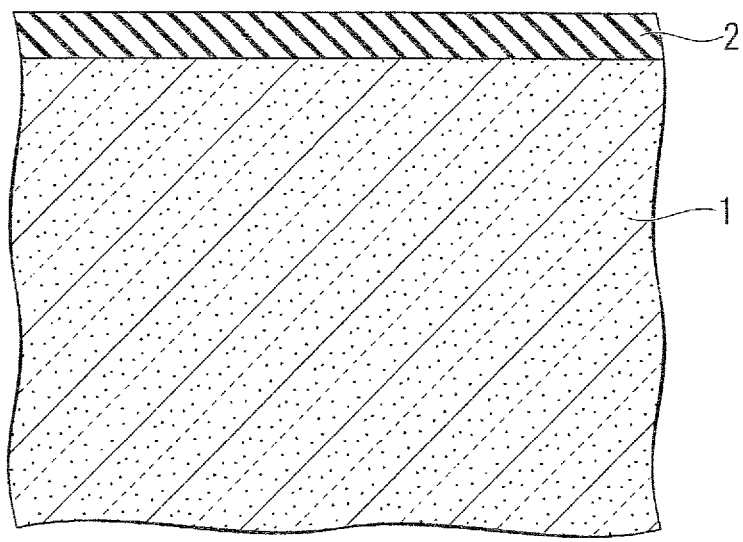
FIG. 3B is a fragmentary cross sectional elevation view, taken along an A-A line of FIG. 3A.
Figure 3C:
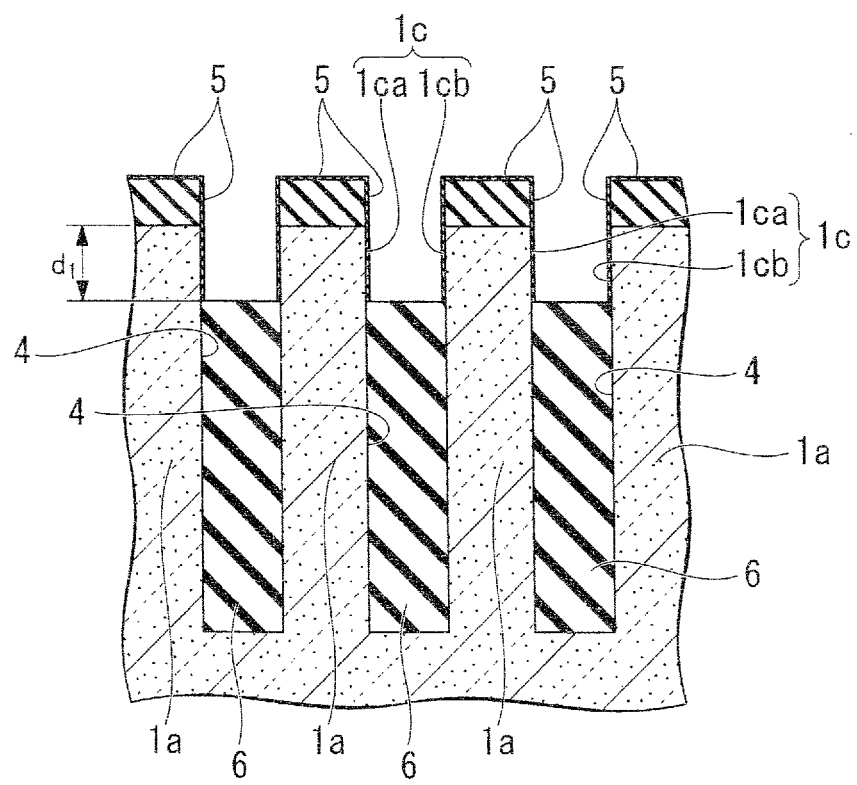
FIG. 3C is a fragmentary cross sectional elevation view, taken along a B-B line of FIG. 3A.

Next, as shown in FIG. 3A to FIG. 3C, the bottom part of the isolation trench 4 is buried to form the second insulating film 6, so that upper part side surfaces 1c of the element formation region 1a remain exposed in the isolation trench (first trench) 4.

Specifically, for example, CVD is used to form a silicon oxynitride film (insulating film) over the entire surface including the inner surface of the isolation region 4, so that the isolation trench 4 is buried with the silicon oxynitride film 6. Next, selective etching back is done by hot phosphoric acid with respect to the silicon oxynitride film (second insulating film) 6, so that the upper surface of the silicon oxynitride film 6 is exposed at approximately 25 nm below the upper surface of the semiconductor substrate (silicon substrate) 1 (the depth d1 in FIG. 3C becoming approximately 25 nm). Next, thermal oxidation (ISSG: in situ steam generation) is done to cause oxidation, so as to form the oxide film 5 having a thickness of approximately 4 nm on the surfaces of the exposed silicon substrate surface (upper part side surface) 1c and the silicon nitride film (first insulating film) 2. Because oxidation by ISSG is radical oxidation, it is possible to perform oxidation with substantially no selectivity ratio.

(Single-Side Side Wall Formation Process)

Next, the bottom part of the first trench 4 is buried to form a third insulating film 7a on only one upper part side wall 1ca of the pair of the upper part side surfaces 1c (1ca, 1cb) of the element formation region 1a parallel to the y direction (first direction).

An example of this process is described below in detail, with references made to FIG. 3 to FIG. 9.

(Side Wall Formation Process)

Figure 4A:
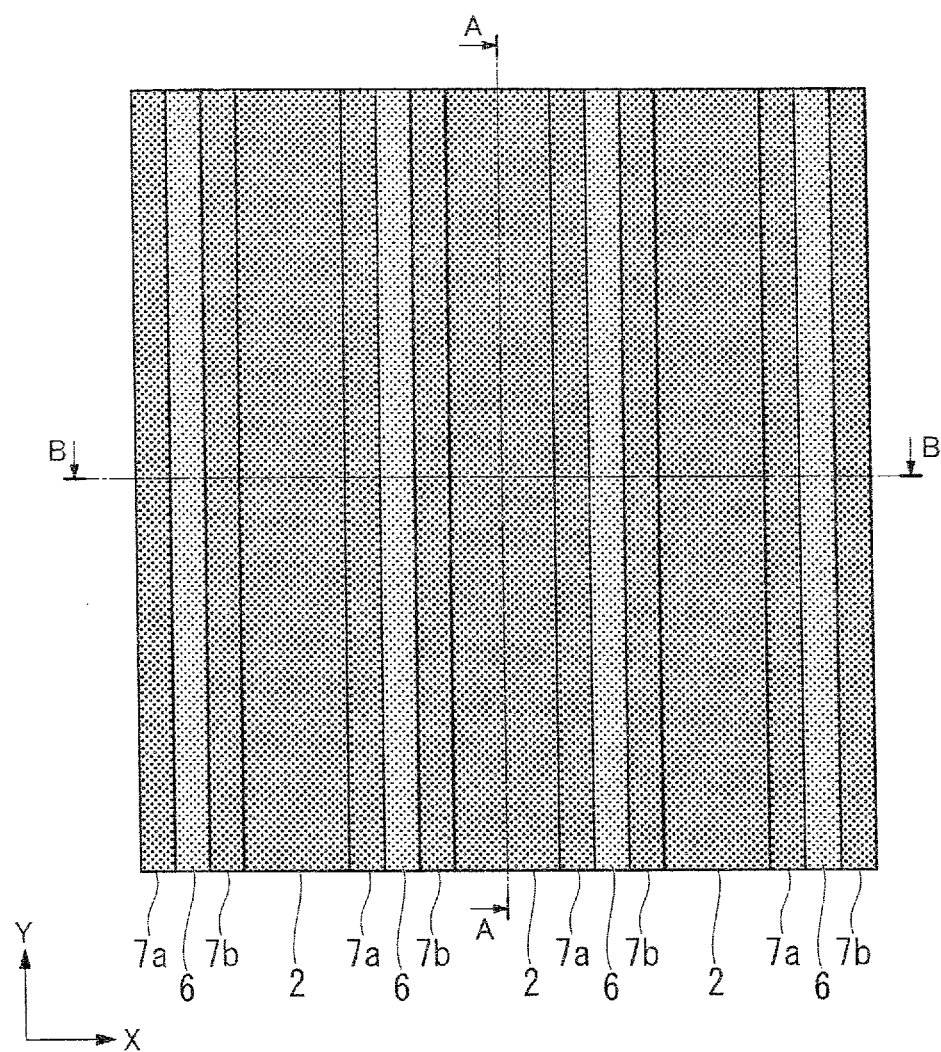
FIG. 4A is a fragmentary plain view of a step, subsequent to the step of FIGS. 3A, 3B, and 3C, involved in the method of forming the semiconductor device of FIGS. 1A, 1B and 1C, in accordance with the embodiment of the present invention.
Figure 4B:
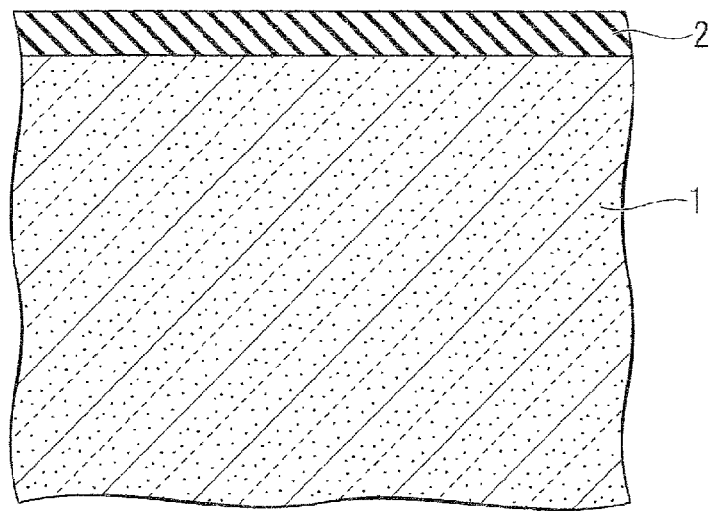
FIG. 4B is a fragmentary cross sectional elevation view, taken along an A-A line of FIG. 4A.
Figure 4C:
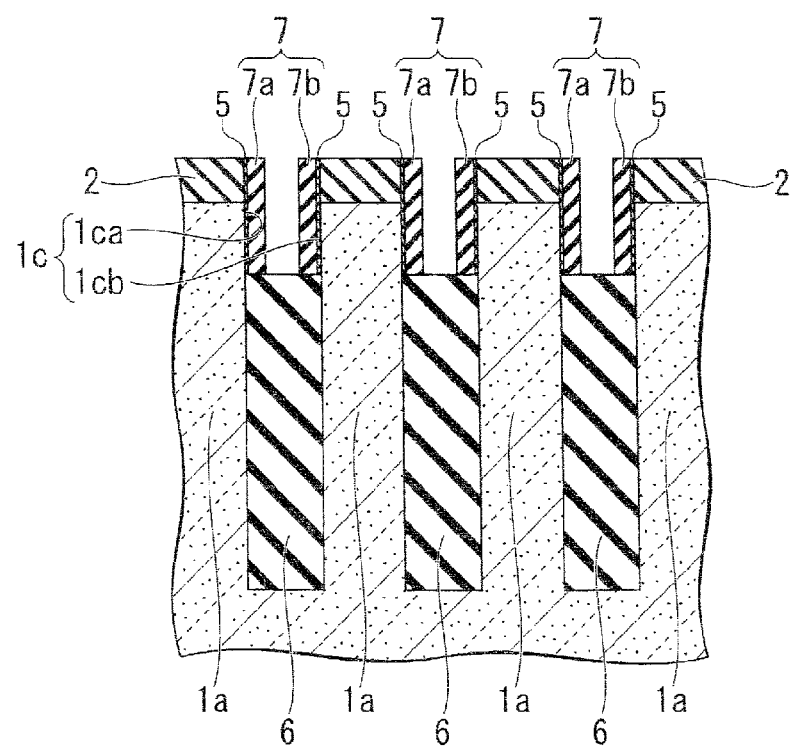
FIG. 4C is a fragmentary cross sectional elevation view, taken along a B-B line of FIG. 4A.

First, as shown in FIG. 4A to FIG. 4C, side walls (third insulating film) 7 (7a, 7b) of the insulating film are formed, with the intervening oxide film 5, on each of the pair of upper part side surfaces 1ca, 1cb of the element formation region 1a parallel to the y direction (first direction).

Specifically, for example, CVD is used to form a silicon nitride film on the entire surface, including the inner surface of the isolation trench 4, after which etching back is done to remove the silicon nitride film over the masking insulating film 2, thereby forming side walls 7 (7a, 7b) made of a silicon nitride film, with the intervening oxide film 5, on the one pair of upper part side surfaces 1ca, 1cb of the element formation region 1a parallel to the y direction.

(Recess Formation Process)

Figure 5A:
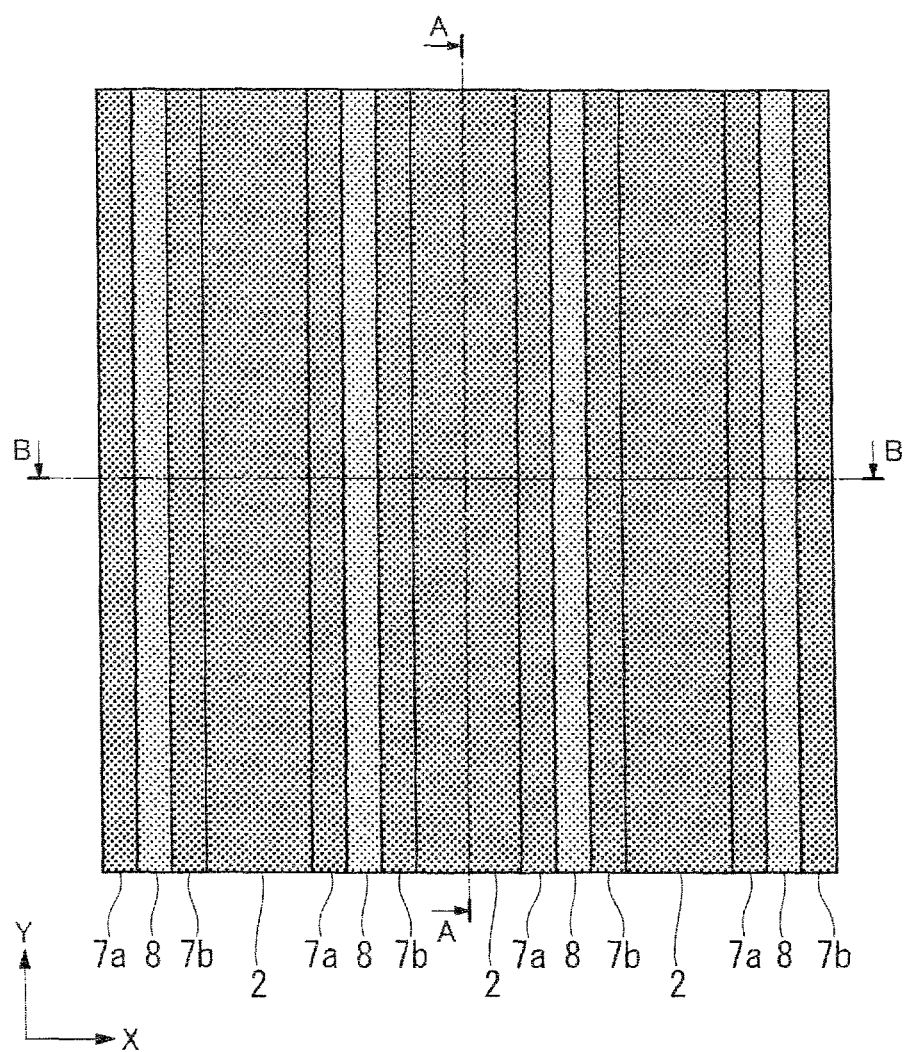
FIG. 5A is a fragmentary plain view of a step, subsequent to the step of FIGS. 4A, 4B, and 4C, involved in the method of forming the semiconductor device of FIGS. 1A, 1B and 1C, in accordance with the embodiment of the present invention.
Figure 5B:
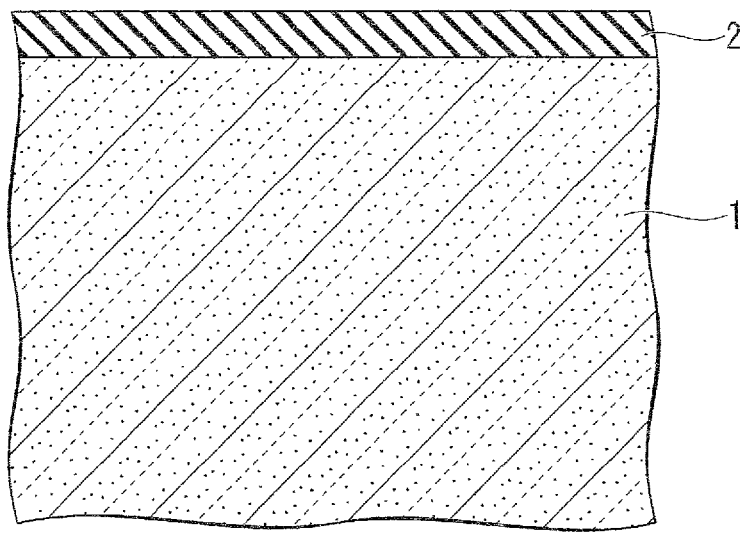
FIG. 5B is a fragmentary cross sectional elevation view, taken along an A-A line of FIG. 5A.
Figure 5C:
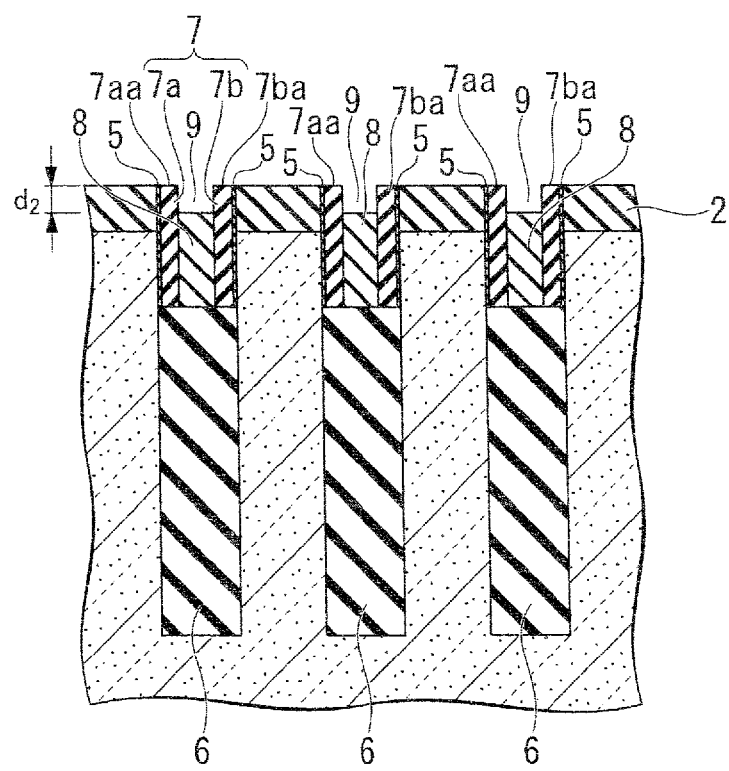
FIG. 5C is a fragmentary cross sectional elevation view, taken along a B-B line of FIG. 5A.

Next, as shown in FIG. 5A to FIG. 5C, an eighth insulating film 8 made of a material that is different from the third insulating film 7 (7a, 7b) is formed inside the isolation trench (first trench) 4 so as to be lower than upper surfaces 7aa, 7ba of the third insulating film 7 (7a, 7b), thereby forming a recess 9 in the top of the eighth insulating film 8 within the isolation trench 4.

Specifically, for example, the silicon oxide film 8 is formed within the isolation trench 4 by using CVD to form a silicon oxide film (eighth insulating film) over the entire surface, including the inside surface of the isolation trench 4, after which dry etching is used to etch back this silicon oxide film (eighth insulating film) to a depth of d2, for example approximately 30 nm, from the upper surface of the silicon oxide film (the silicon oxide film over the silicon nitride film (first insulating film) 2 of the above-noted silicon oxide film by CVD over the entire surface including the inner surface of the isolation trench 4 is not illustrated) over the silicon nitride film (first insulating film) 2 to form a recess 9 above the silicon oxide film (eighth insulating film) 8 within the isolation trench 4.

By this process step, the recess 9 that is surrounded by the side walls 7a and 7b is formed over the silicon oxide film (eighth insulating film) 8 over the silicon oxynitride film 6 within the isolation trench 4.

(Formation Process for Single-Side Side Wall Formation Mask)

Figure 6A:
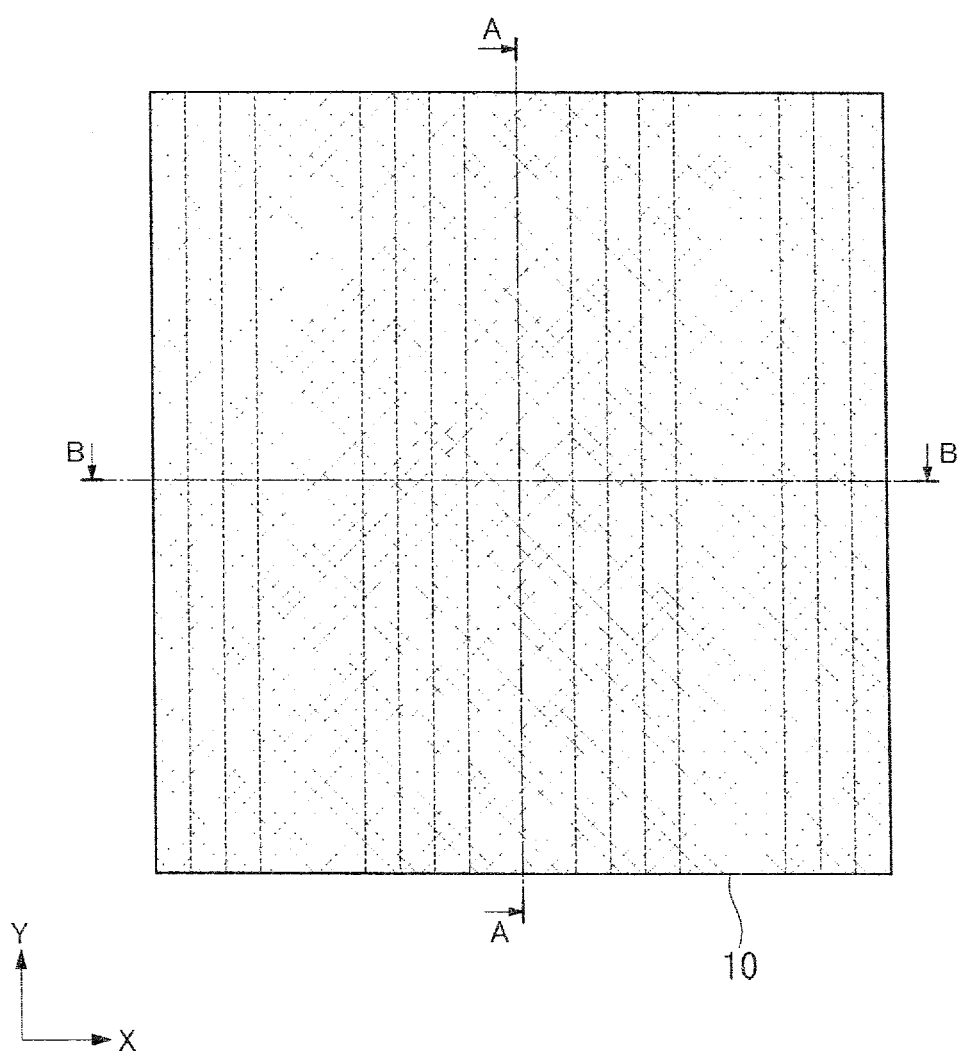
FIG. 6A is a fragmentary plain view of a step, subsequent to the step of FIGS. 5A, 5B, and 5C, involved in the method of forming the semiconductor device of FIGS. 1A, 1B and 1C, in accordance with the embodiment of the present invention.
Figure 6B:
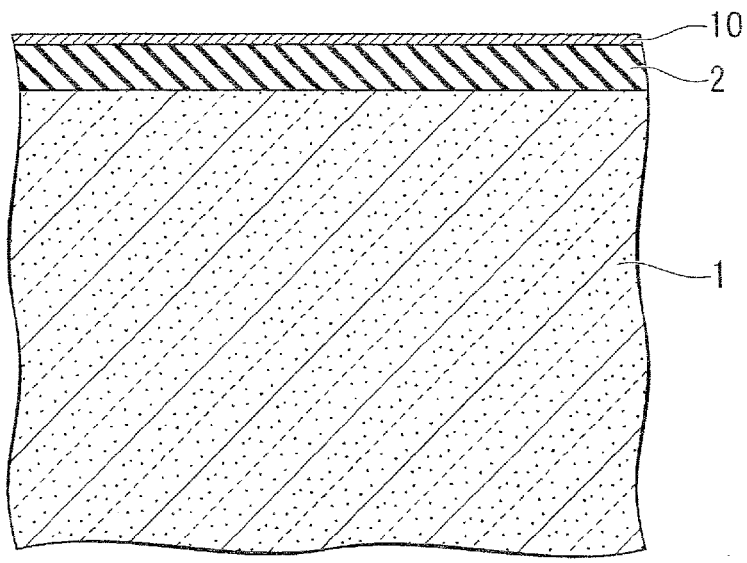
FIG. 6B is a fragmentary cross sectional elevation view, taken along an A-A line of FIG. 6A.
Figure 6C:
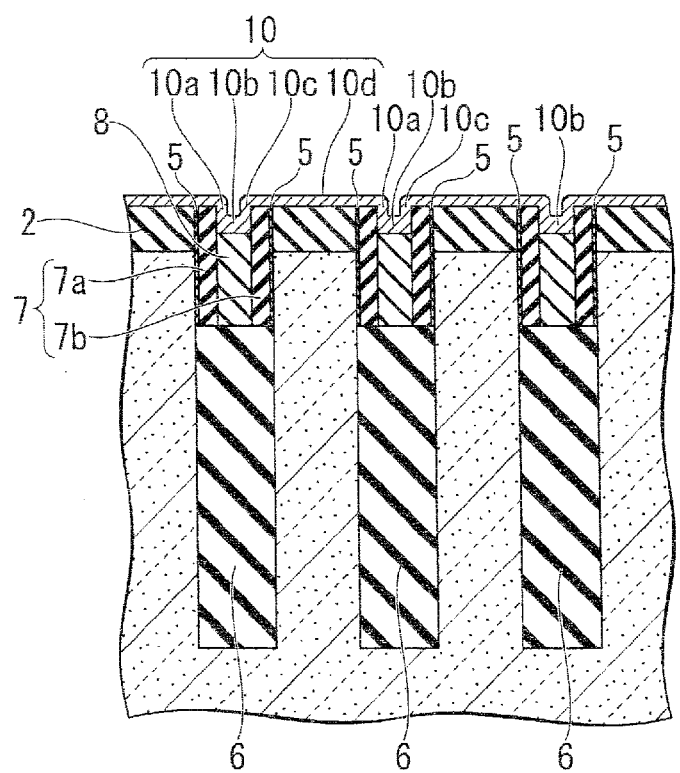
FIG. 6C is a fragmentary cross sectional elevation view, taken along a B-B line of FIG. 6A.

Next, first as shown in FIG. 6A to FIG. 6C, the bottom part of the recess 9 is buried to form a second semiconductor film 10 over the entire surface, including the recess 9. That is, the entire surface, including the inner surface of the isolation trench 4 is filled by burying the bottom part of the inside of the isolation trench 4, thereby forming the second semiconductor film 10 that is for masking to form the sidewall on one upper part side surface (one side) 1ca of a pair of the upper side surfaces 1c of the element formation region 1a.

Specifically, for example, CVD is used to form the amorphous silicon film (second semiconductor film) 10 having a thickness of approximately 10 nm, at a deposition temperature of 540° C. or lower over the entire surface, including the inner surface of the isolation trench 4. The amorphous silicon film (second semiconductor film) 10 is constituted by parts 10a and 10c (side surface amorphous films) formed on the upper side surfaces (inner walls on the inside of the isolation trench 4) of the element formation region 1a, a part 10b (horizontal amorphous film) formed on the eighth insulating film 8 inside the isolation trench 4, and a part 10d (upper surface amorphous film) formed over the silicon nitride film 2, with an intervening silicon oxide film (not shown). Amorphous silicon has the advantage that there is no influence of crystal grains, which can cause non-uniform etching at the stage of etching the amorphous silicon film.

In the process step shown in FIG. 6A to FIG. 6C, the side wall 7a on an upper side surface 1ca of the element formation region 1a with the intervening oxide film 5, the side wall 7b on the upper part side surface 1cb with the intervening oxide film 5, the silicon oxide film (eighth insulating film) 8, a side-surface amorphous silicon film 10a, a horizontal amorphous silicon film 10b, and a side surface amorphous silicon film 10c on the silicon oxide film (eighth insulating film) 8 are formed over the silicon oxynitride film 6 within the isolation trench 4.

Figure 7A:
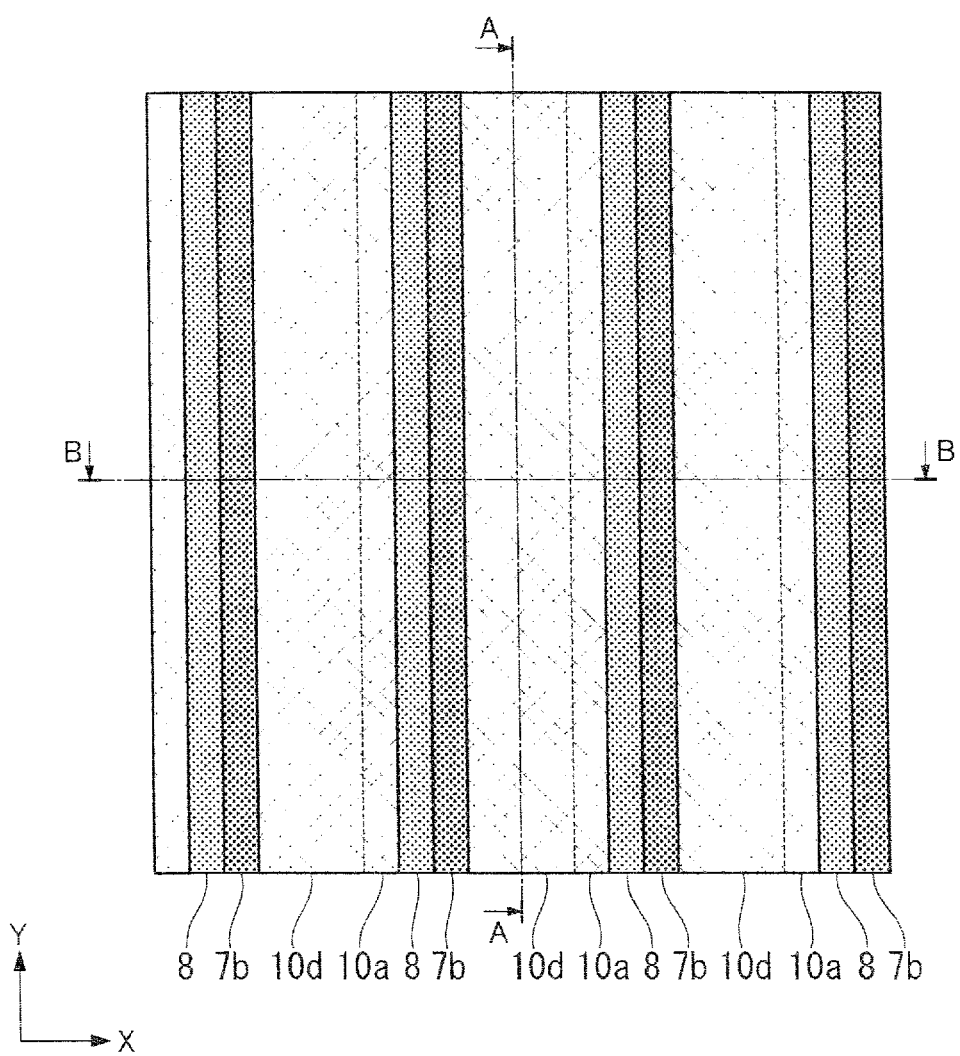
FIG. 7A is a fragmentary plain view of a step, subsequent to the step of FIGS. 6A, 6B, and 6C, involved in the method of forming the semiconductor device of FIGS. 1A, 1B and 1C, in accordance with the embodiment of the present invention.
Figure 7B:
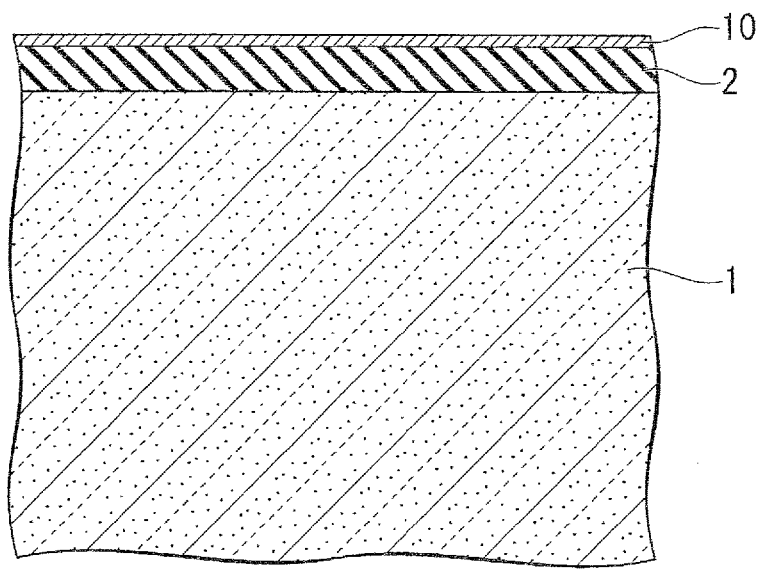
FIG. 7B is a fragmentary cross sectional elevation view, taken along an A-A line of FIG. 7A.
Figure 7C:
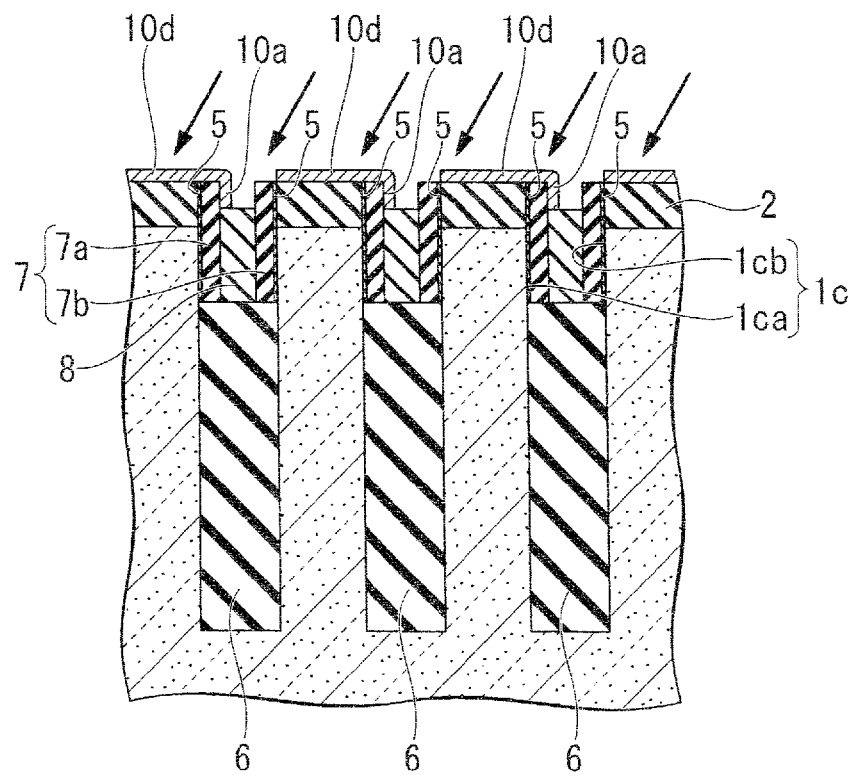
FIG. 7C is a fragmentary cross sectional elevation view, taken along a B-B line of FIG. 7A.

Next, as shown in FIG. 7A to FIG. 7C, after implanting an impurity into the second semiconductor film 10 at an angle of inclination with respect to the perpendicular direction thereto, wet etching is done to remove, of the second semiconductor film 10, a part 10c of the second semiconductor film that is formed, with the intervening third insulating film 7b, on the part of the upper part side surface 1cb that is the opposite side to the one side upper part side surface 1ca, and the part of the part 10b of the second semiconductor film over the eighth insulating film 8.

Specifically, for example, of the amorphous silicon film 10, ion implantation is done in the direction of the arrows in FIG. 7C into the side-surface amorphous silicon film 10a on one side (part of the amorphous silicon film on the left side in FIG. 6C), a part of the horizontal amorphous silicon film 10b (approximately the left-side half of the amorphous silicon film part formed on the bottom part in FIG. 6C), and an upper surface amorphous silicon film 10d, so as to remove 10c, which is one of the side-surface amorphous silicon films (part of the amorphous silicon film on the right side in FIG. 6C) and a part of the horizontal amorphous silicon film 10b (the right side half of the part of the amorphous silicon film formed at the bottom part in FIG. 6C).

Boron fluoride ($BF_2$) can be cited as an impurity added to the amorphous silicon film 10. A method that can be cited for adding an impurity to the upper surface amorphous silicon film 10d, the side-surface amorphous silicon film 10a, and the horizontal amorphous silicon film 10b without implanting the impurity into the side-surface 10c of the one side of the side-surface amorphous silicon films 10a and 10c, for example, oblique ion implantation or the like. FIG. 7C shows by example the use of oblique ion implantation to implant an impurity into the amorphous silicon film 10.

In FIG. 7C, in the case of implanting an impurity into the amorphous silicon film 10, it is necessary to add an impurity not only into the side-surface amorphous silicon film 10a, but also into a part of the horizontal amorphous silicon film 10b. For this reason, as a method of implanting the impurity into the amorphous silicon film 10, a two-stage implantation method that uses different angles may be used, so that the implantation angles are appropriate for each of the locations, the side-surface amorphous silicon film 10a and the horizontal amorphous silicon film 10b. The term implantation angle as used here means the angle of inclination from perpendicular with respect to the surface of the semiconductor substrate 1.

In the case of implanting an impurity into the amorphous silicon film 10 using two-stage implantation, it is preferable, for example, to make the accelerating energy 5 keV and the implantation dose $2 \times 10^{14}$ cm$^{-2}$, and to use a combination of implantation at an angle of 20° and implantation at an angle of 30°. The implantation angle can be appropriately changed, in accordance with the film thickness of the amorphous silicon film 10, the surface area of the horizontal amorphous silicon film 10b, and the depth of the side-surface amorphous silicon films 10a, 10c.

To remove a part of the amorphous silicon film 10 into which an impurity is not implanted (that is 10c, which is one of the side-surface amorphous silicon films (the part of the amorphous silicon film on the right side in FIG. 7C) and a part of the horizontal amorphous silicon film 10b (the right-side half part of the part of the amorphous silicon film formed on the bottom part in FIG. 7C)), wet etching is done, using ammonia water ($NH_3$) or the like as the etching fluid.

In the process step shown in FIG. 7A to FIG. 7C, the side wall 7a with the intervening oxide film 5 on the upper part side surface 1ca of the element formation region 1a; the side wall 7b with the intervening oxide film 5 on the upper part side 1cb; the oxide film (eighth insulating film) 8; and the side-surface amorphous silicon film 10a over the silicon oxide film (eighth insulating film) 8 remain over the silicon oxynitride film 6 within the isolation trench 4.

(Process of Removing One Side Wall)

Figure 8A:
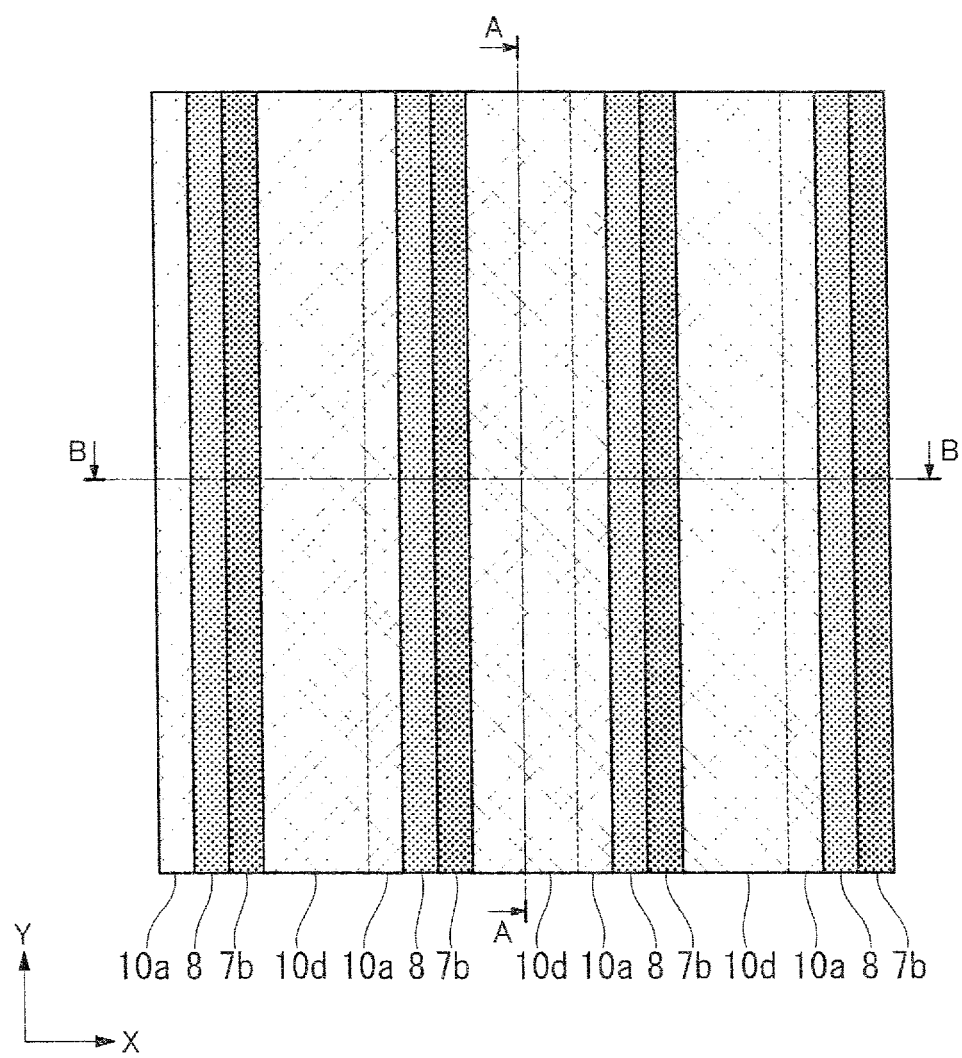
FIG. 8A is a fragmentary plain view of a step, subsequent to the step of FIGS. 7A, 7B, and 7C, involved in the method of forming the semiconductor device of FIGS. 1A, 1B and 1C, in accordance with the embodiment of the present invention.
Figure 8B:
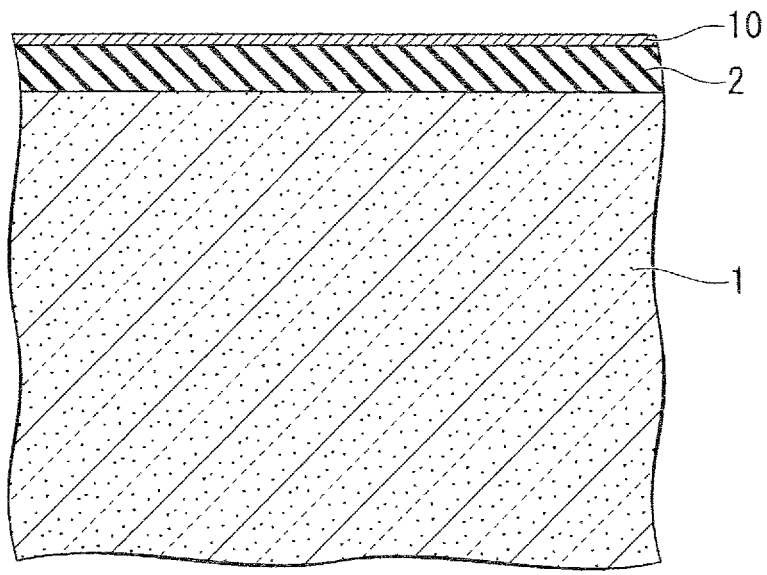
FIG. 8B is a fragmentary cross sectional elevation view, taken along an A-A line of FIG. 8A.
Figure 8C:
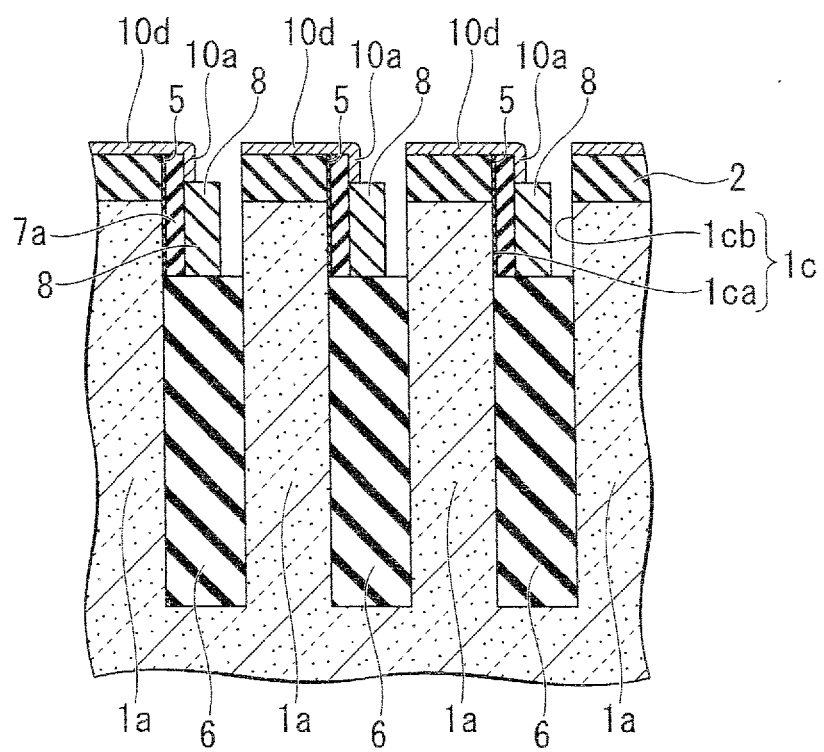
FIG. 8C is a fragmentary cross sectional elevation view, taken along a B-B line of FIG. 8A.

Next, as shown in FIG. 8A to FIG. 8C, of the one pair of upper side surfaces 1ca, 1cb of the element formation region 1a, the third insulating film 7b on the upper part side surface 1cb is removed. That is, of the side walls 7a, 7b formed on both sides of the exposed surface of the upper part of the isolation trench 4, with the intervening oxide film 5, the side wall 7b on one side that is not covered by the mask of the second semiconductor film 10 (the side wall on the right side in FIG. 8C) is removed.

Specifically, for example, wet etching using hot phosphoric acid ($H_3PO_4$) is used to remove the side wall 7b on one side that is not covered by the amorphous silicon film 10 mask. Because the side wall 7a is covered by the amorphous silicon film 10 mask and the silicon oxide film (eighth insulating film) 8, it is not removed when this wet etching is done, and remains on the upper side surface 1ca of the element formation region 1a.

By this process step, the side wall 7a over the upper part side surface 1ca of the element formation region 1a, with the intervening oxide film 5, the silicon oxide film (eighth insulating film) 8, and the side surface amorphous silicon film 10a remain over the silicon oxynitride film 6 within the isolation trench 4.

(Eighth Insulating Film Removing Process)

Figure 9A:
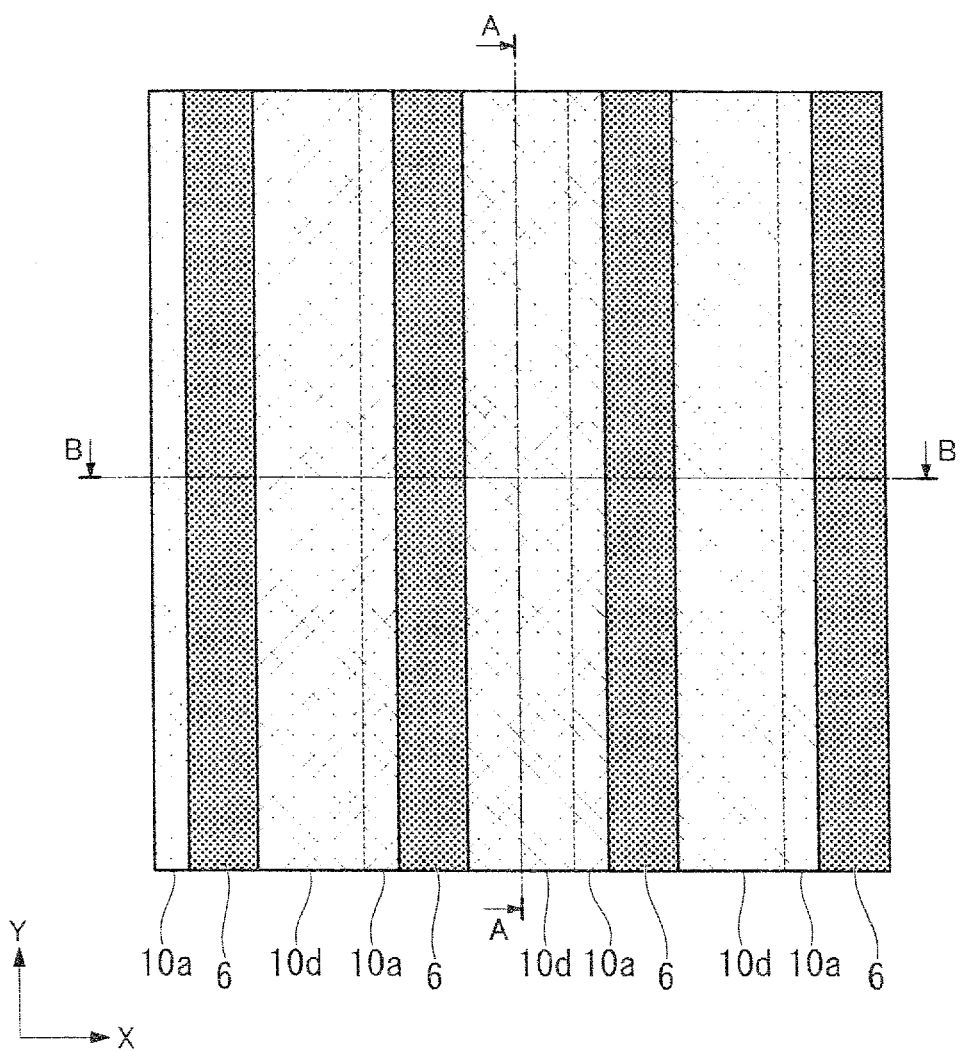
FIG. 9A is a fragmentary plain view of a step, subsequent to the step of FIGS. 8A, 8B, and 8C, involved in the method of forming the semiconductor device of FIGS. 1A, 1B and 1C, in accordance with the embodiment of the present invention.
Figure 9B:
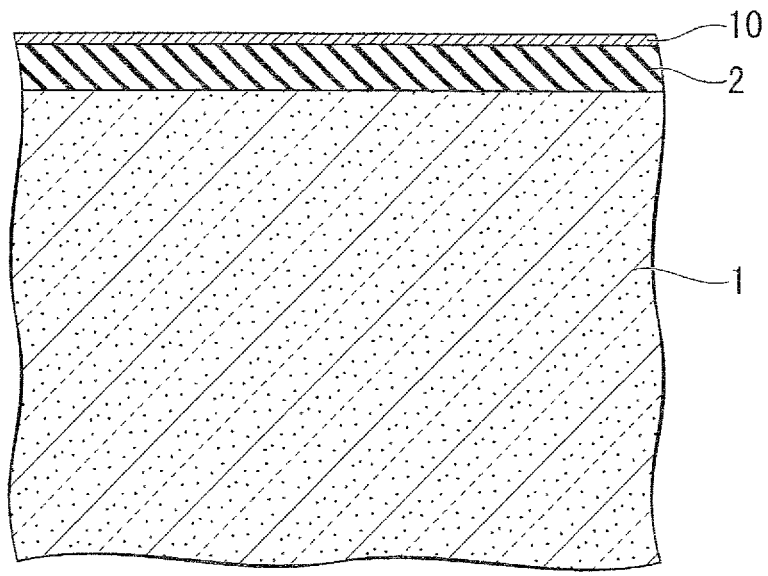
FIG. 9B is a fragmentary cross sectional elevation view, taken along an A-A line of FIG. 9A.
Figure 9C:
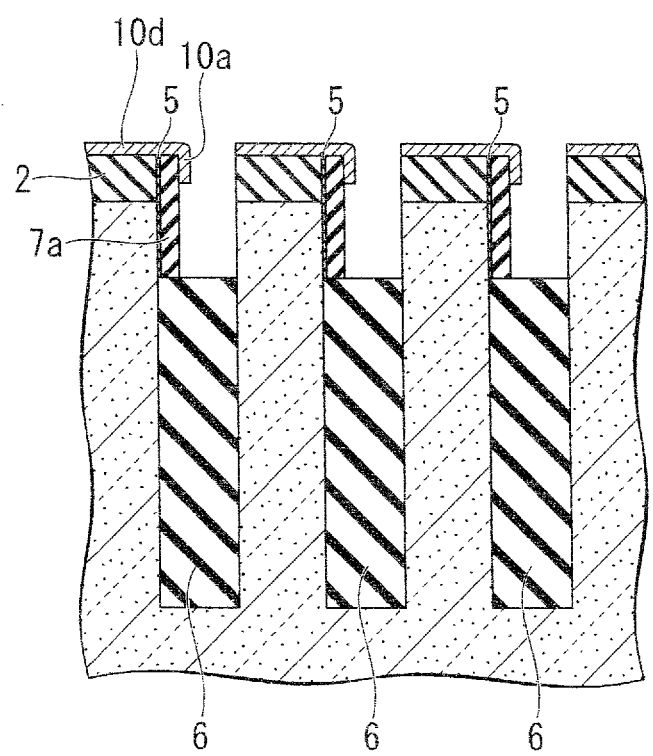
FIG. 9C is a fragmentary cross sectional elevation view, taken along a B-B line of FIG. 9A.

Next, as shown in FIG. 9A to FIG. 9C, the eighth insulating film 8 within the isolation trench 4 is removed.

Specifically, for example, the silicon oxide film (eighth insulating film) 8 over the silicon oxynitride film (insulating film) 6 is removed by wet etching, using hydrofluoric acid (HF).

By this process step, the side wall 7a with the intervening oxide film 5 on the upperside surface 1ca of the element formation region 1a, and the side surface amorphous silicon film 10a remain over the silicon oxynitride film 6 within the isolation trench 4.

(Single-Side Side Wall Formation Mask Removal Process)

Figure 10A:
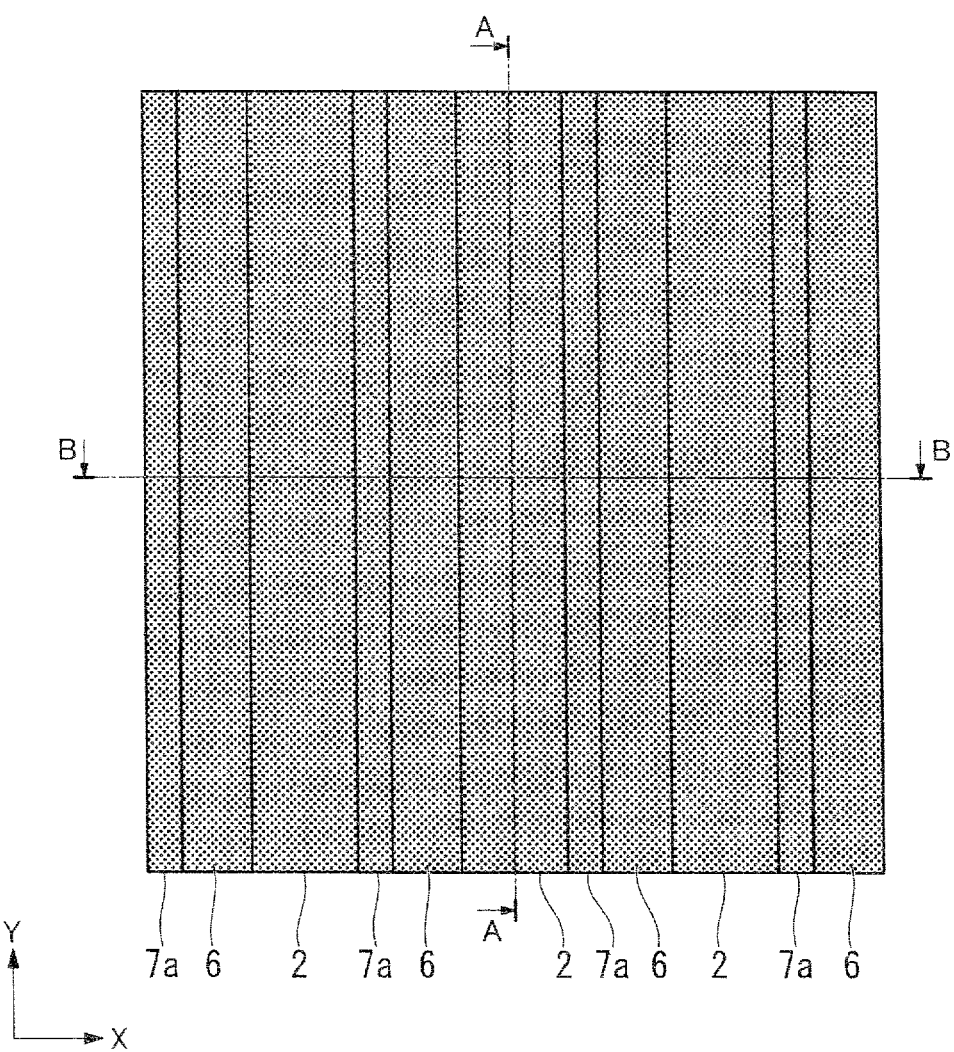
FIG. 10A is a fragmentary plain view of a step, subsequent to the step of FIGS. 9A, 9B, and 9C, involved in the method of forming the semiconductor device of FIGS. 1A, 1B and 1C, in accordance with the embodiment of the present invention.
Figure 10B:
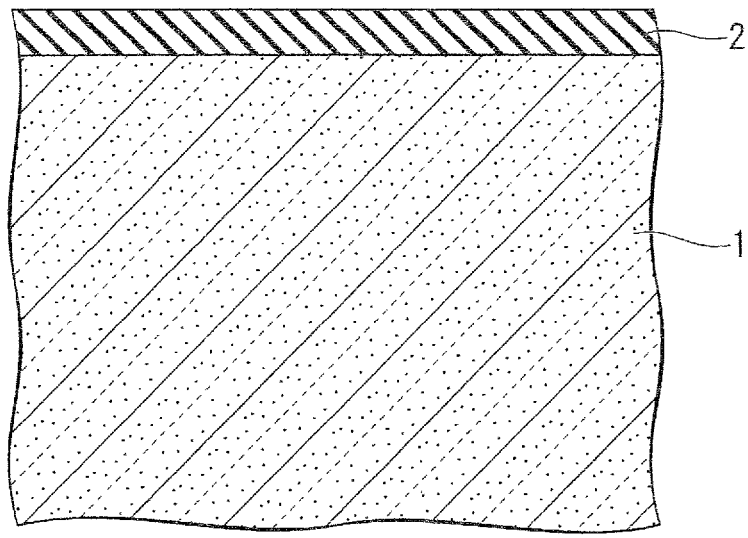
FIG. 10B is a fragmentary cross sectional elevation view, taken along an A-A line of FIG. 10A.
Figure 10C:
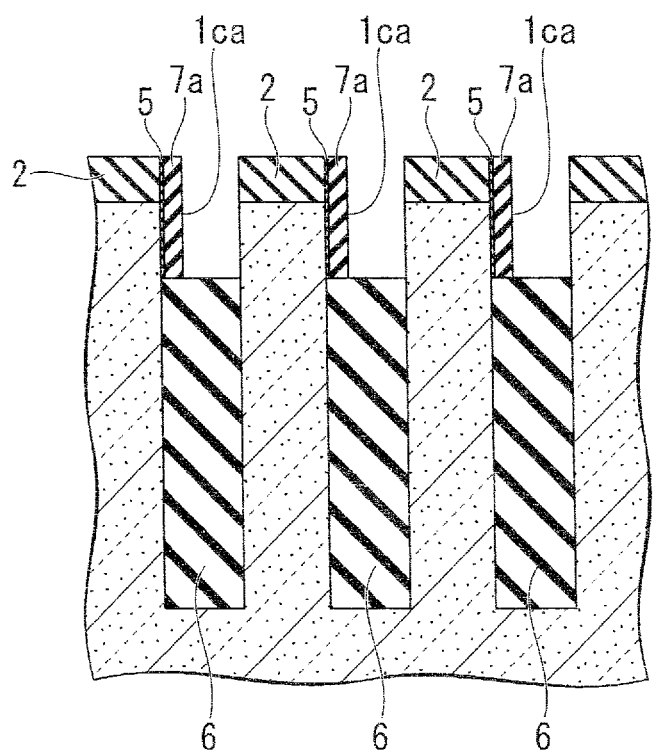
FIG. 10C is a fragmentary cross sectional elevation view, taken along a B-B line of FIG. 10A.

Next, as shown in FIG. 10A to FIG. 10C, the second semiconductor film 10, which is the mask for forming the single-side side wall, is removed.

Specifically, for example, etching back is done using anisotropic etching, so as to remove the amorphous silicon film 10, which is the mask for forming the single-side side wall.

By this process step, the side wall 7a with the intervening oxide film 5 on the upper part side surface 1ca of the element formation region 1a remains over the silicon oxynitride film 6 within the isolation trench 4.

By this process step, it is possible to form the single-side side wall 7a made of a silicon nitride film over the silicon oxynitride film 6 within the isolation trench 4.

(Isolation Trench Filling and Planarization Process)

Figure 11A:
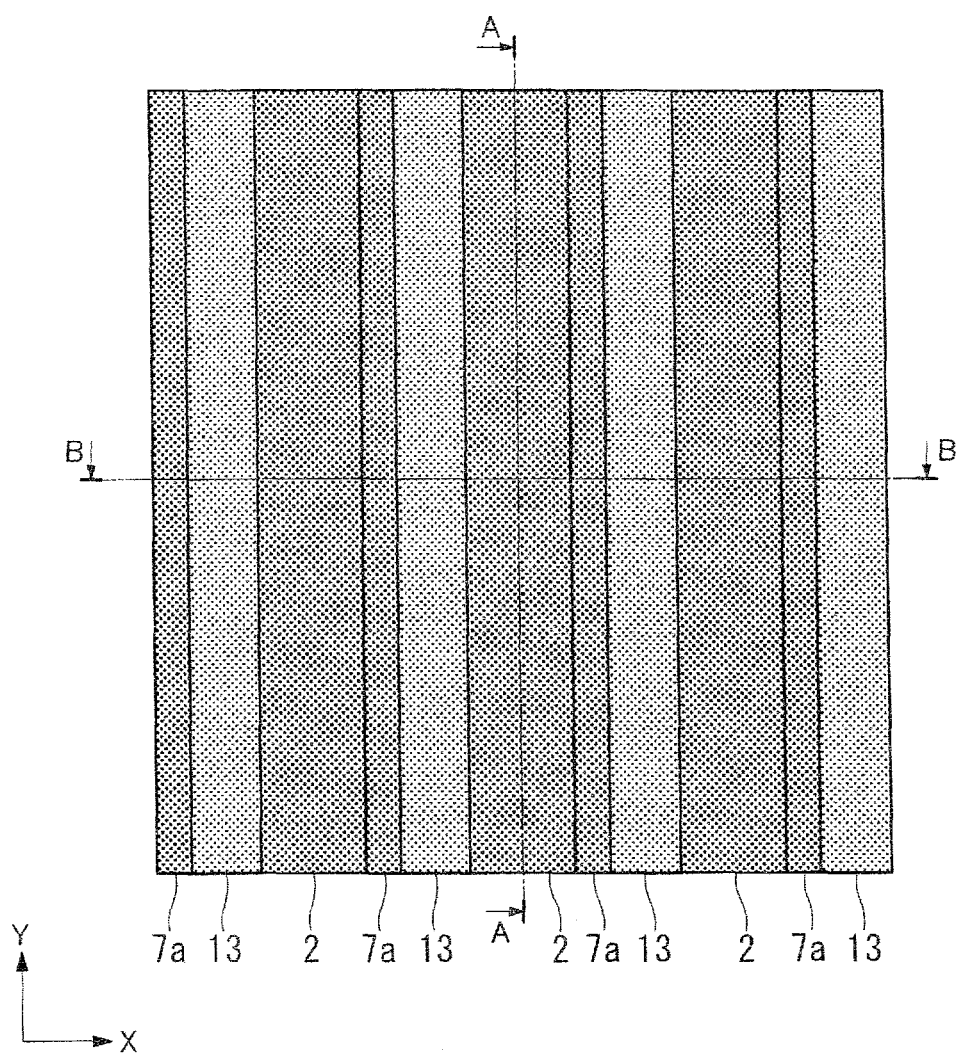
FIG. 11A is a fragmentary plain view of a step, subsequent to the step of FIGS. 10A, 10B, and 10C, involved in the method of forming the semiconductor device of FIGS. 1A, 1B and 1C, in accordance with the embodiment of the present invention.
Figure 11B:
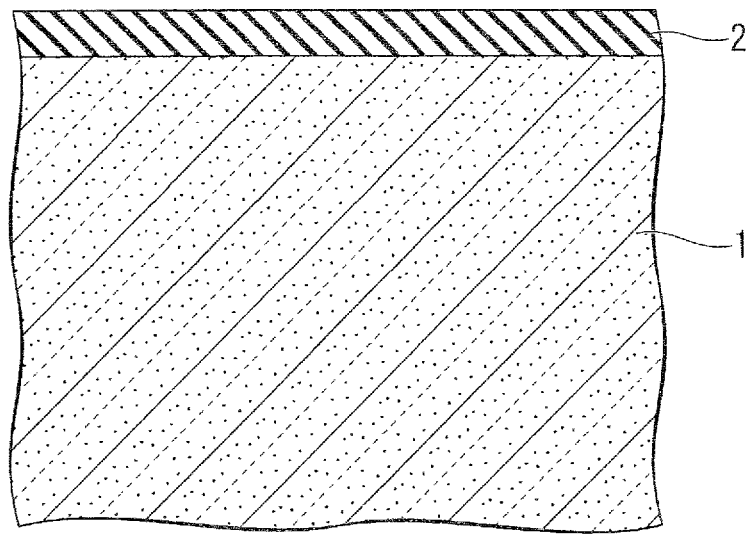
FIG. 11B is a fragmentary cross sectional elevation view, taken along an A-A line of FIG. 11A.
Figure 11C:
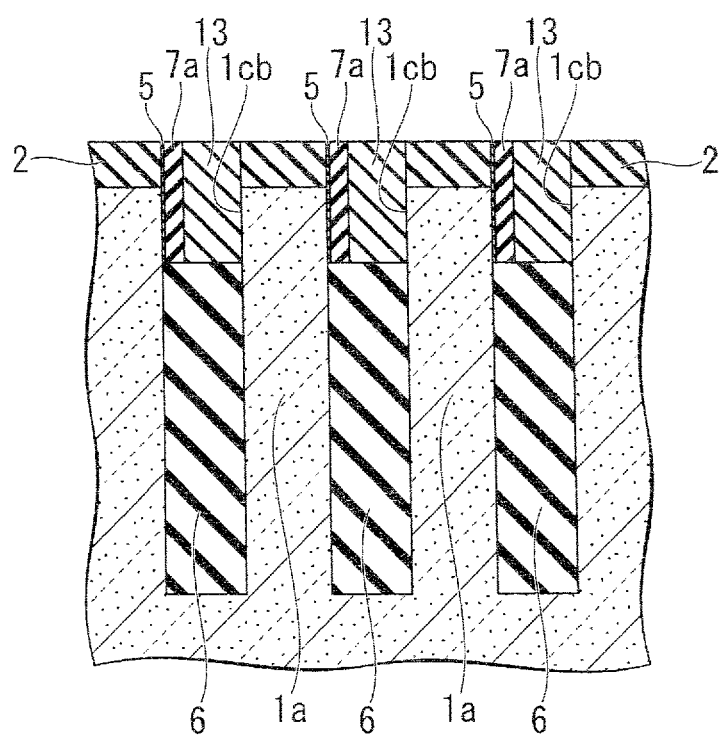
FIG. 11C is a fragmentary cross sectional elevation view, taken along a B-B line of FIG. 11A.

Next, as shown in FIG. 11A to FIG. 11C, a fourth insulating film 13 made of a material that is different from that of the third insulating film 7a is formed so as to fill the isolation trench (first trench) 4. By filling the isolation trench 4 with an insulating film, the silicon surface of the side surface 1cb of the element formation region 1a that was exposed within the isolation trench 4 is protected.

Specifically, for example, over the entire surface including the inner surface of the isolation trench (first trench) 4, HDP-CVD (high-density plasma chemical vapor deposition) is used to deposit the silicon oxide film (fourth insulating film) 13 made of a material that is different from that of the silicon nitride film that is the material of the side wall 7a, after which chemical mechanical polishing (CMP) is performed, planarization polishing being done until the surface of the silicon nitride film 2 is exposed, thereby forming the silicon oxide film (fourth insulating film) 13 that buries the isolation trench (first trench) 4.

By this process step, the inside of the isolation trench 4 is filled by the side wall 7a and the silicon oxide film (fourth insulating film) 13, with the intervening oxide film 5, on the upper side surface 1ca of the element formation region 1a.

(Buried Word Line Formation Process)

Figure 12A:
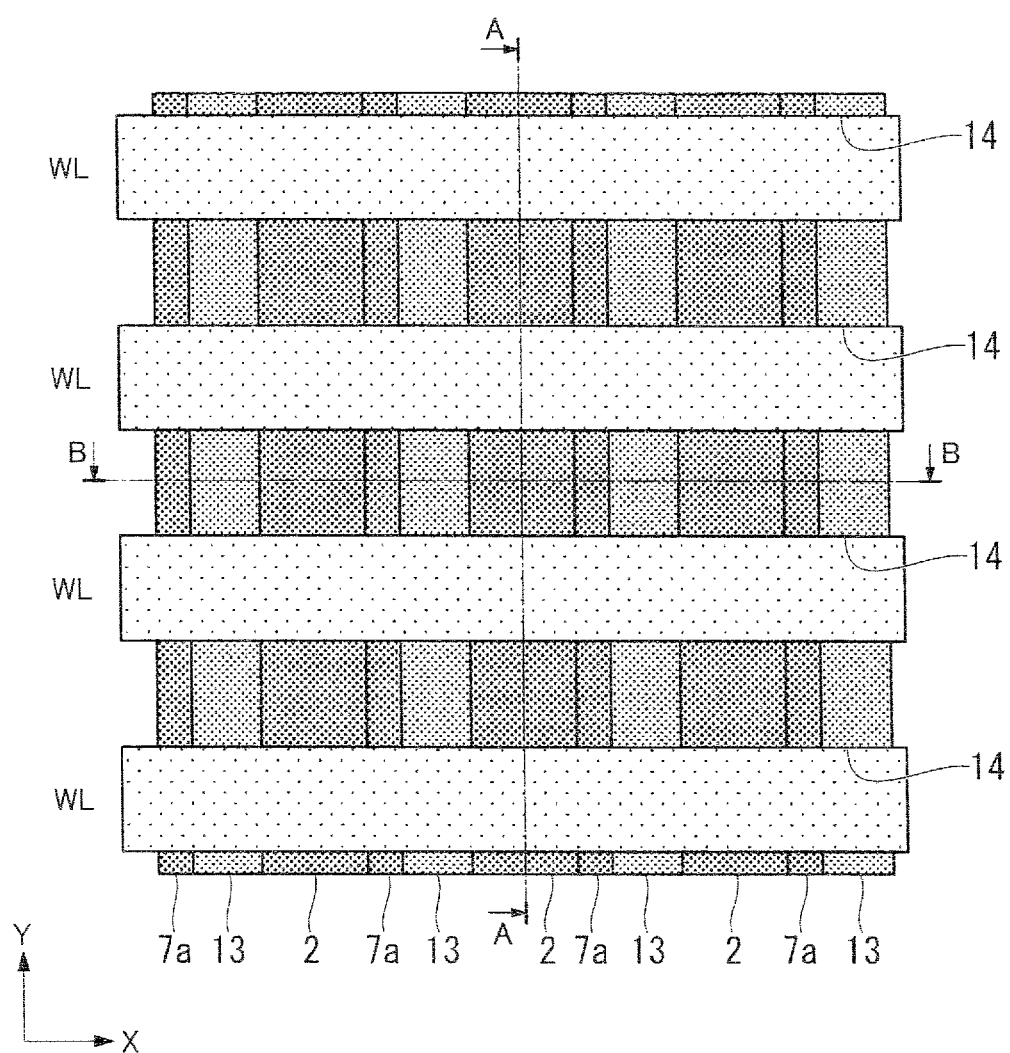
FIG. 12A is a fragmentary plain view of a step, subsequent to the step of FIGS. 11A, 11B, and 11C, involved in the method of forming the semiconductor device of FIGS. 1A, 1B and 1C, in accordance with the embodiment of the present invention.
Figure 12B:
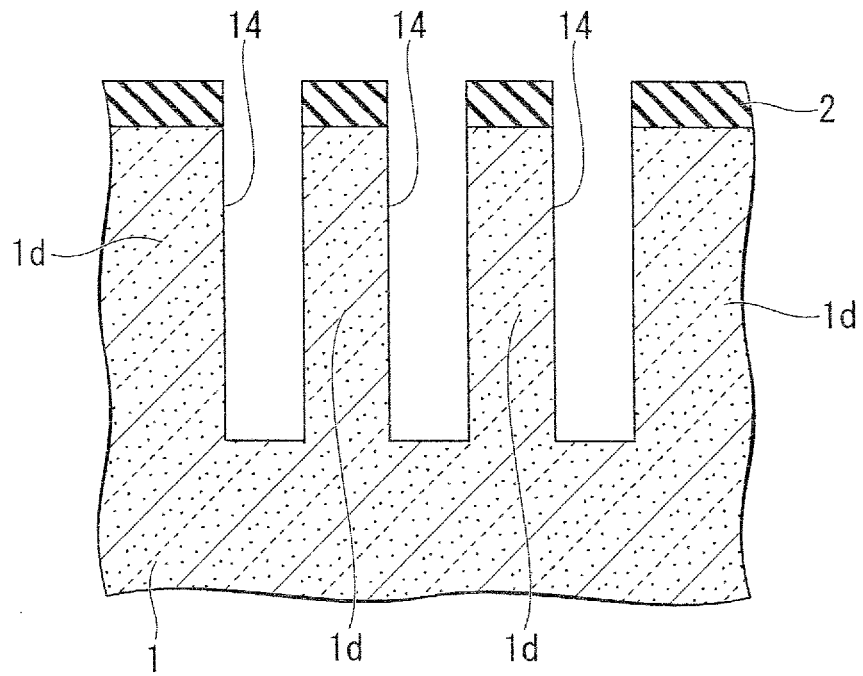
FIG. 12B is a fragmentary cross sectional elevation view, taken along an A-A line of FIG. 12A.
Figure 12C:
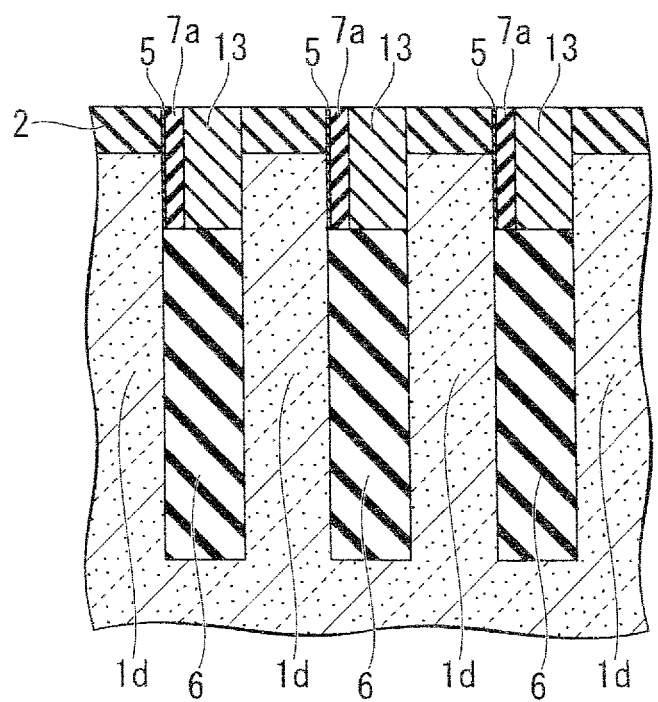
FIG. 12C is a fragmentary cross sectional elevation view, taken along a B-B line of FIG. 12A.

Next, as shown in FIG. 12A to 12C, first, the plurality of word line formation trench (second trench) 14 is formed so as to extend linearly in the x direction (second direction), and to be perpendicular to the y direction (first direction), and arranged in a separated manner over the surface of the semiconductor substrate 1, thereby separating the element formation region 1a in the x direction and forming a plurality of semiconductor pillars 1d.

Specifically, for example, the masking silicon nitride film and the carbon film (amorphous carbon film) are successively deposited, and patterning is done in the shape of a pattern of the word line formation trench 14 that extends in the x direction (second direction) and are arranged separated in the y direction (first direction). Next, dry etching is done to etch the silicon substrate 1 to form the word line formation trenches 14. The word line formation trench 14 is formed as a linearly shaped pattern, extending in a first direction (x direction) that intersects with the active region 1a.

By this process step, the active region (element formation region) 1a is partitioned on the semiconductor substrate 1 by the isolation trenches 4 and the word line formation trenches 14, so as to be separated by each of the semiconductor pillars 1d that are erected perpendicularly with respect to the main surface of the semiconductor substrate 1.

Figure 13A:
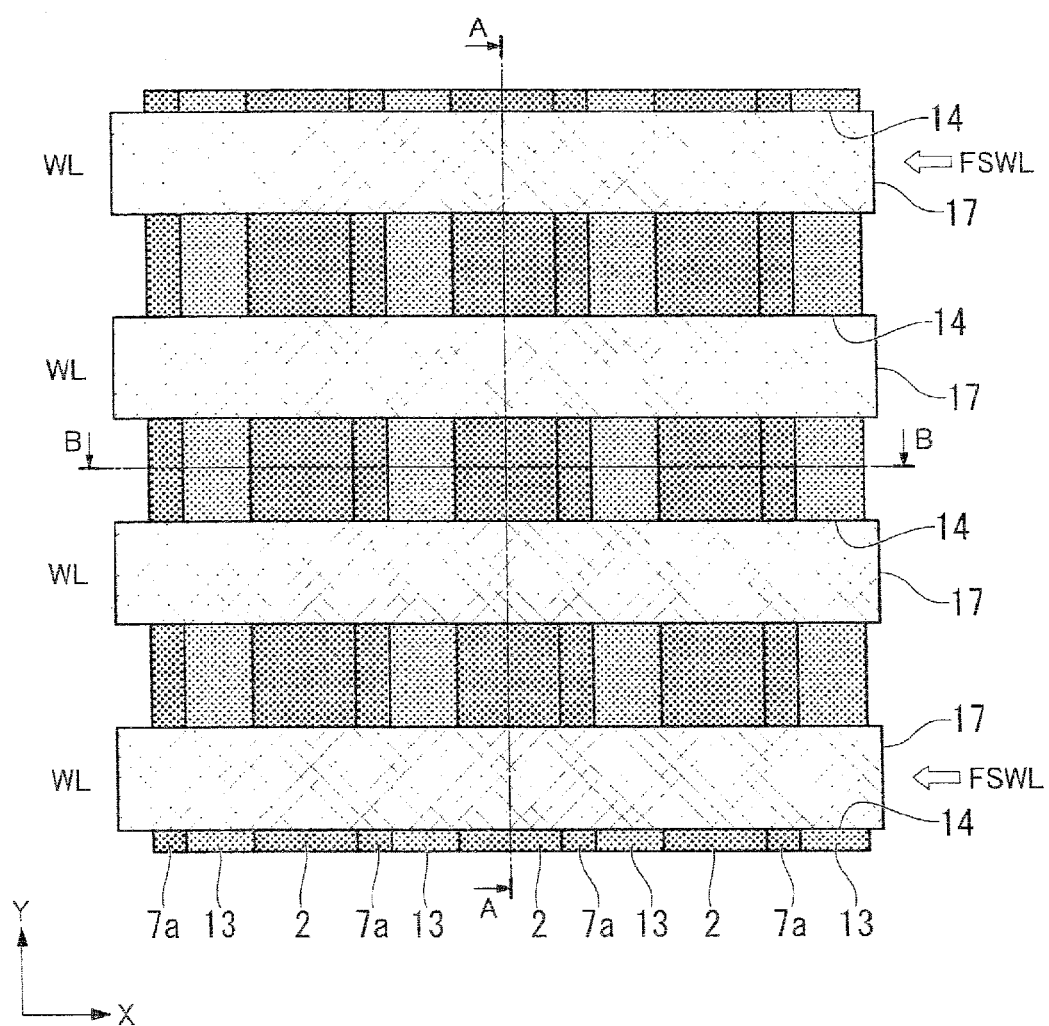
FIG. 13A is a fragmentary plain view of a step, subsequent to the step of FIGS. 12A, 12B, and 12C, involved in the method of forming the semiconductor device of FIGS. 1A, 1B and 1C, in accordance with the embodiment of the present invention.
Figure 13B:
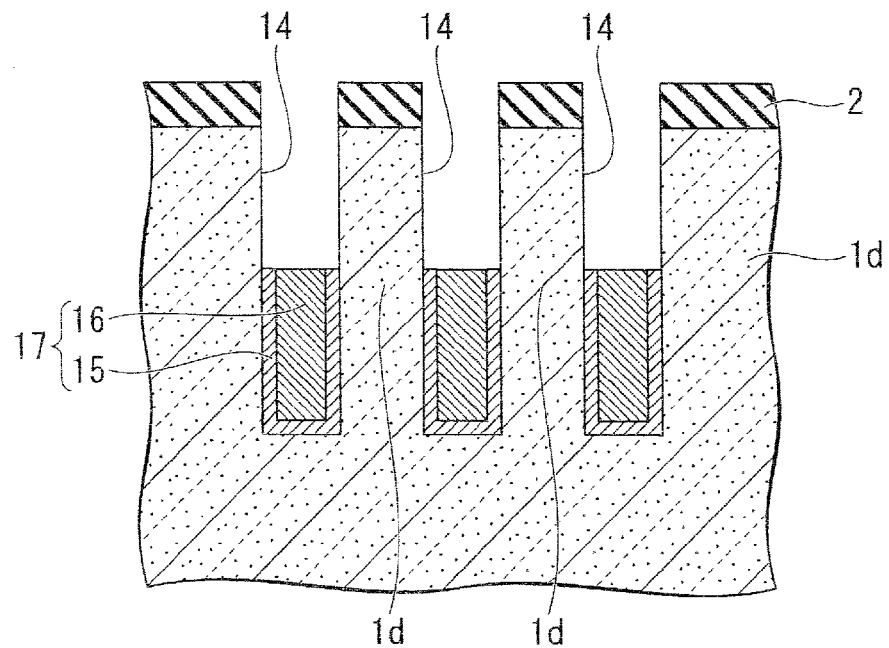
FIG. 13B is a fragmentary cross sectional elevation view, taken along an A-A line of FIG. 13A.
Figure 13C:
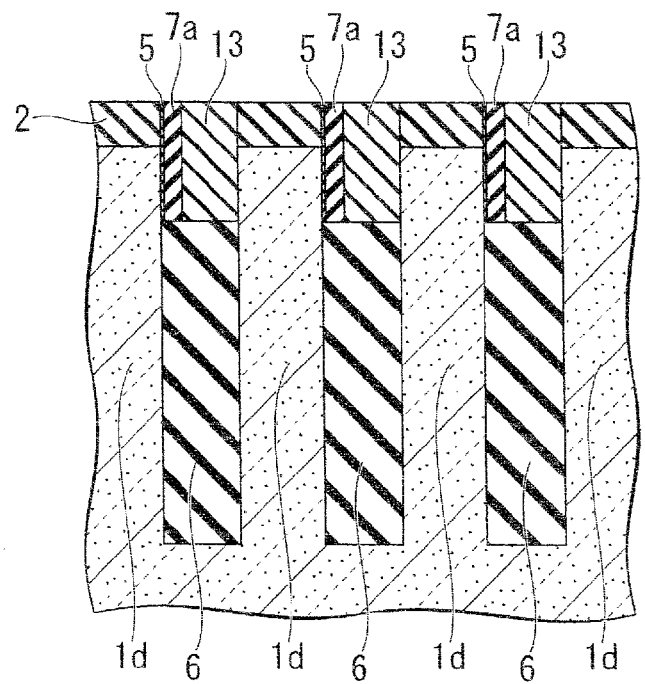
FIG. 13C is a fragmentary cross sectional elevation view, taken along a B-B line of FIG. 13A.

Next, as shown in FIG. 13A to 13C, the word line 17 is formed on the bottom part within the word line formation trench (second trench) 14 with an intervening fifth insulating film (not shown) that is formed on the inner wall of the word line formation trench 14.

Specifically, for example, a gate oxide film (fifth insulating film) is formed with a film thickness of, for example, 4 nm, so as to cover the inner wall of the word line formation trench (second trench) 14. When this is done, for example, thermal oxidation by ISSG (in situ stream generation) is done of the inner surface layer of the word line formation trench 14, thereby forming the gate oxide film (not shown).

Next, as a gate (word line) material on the gate oxide film (fifth insulating film) in the word line formation trench 14, for example, a titanium nitride (TiN) layer 15 is formed on the bottom part of the side surface and the bottom surface of the word line formation trench 14, and a tungsten (W) layer 16 is deposited on the titanium nitride (TiN) layer 15, thereby forming a TiN/W deposition film 17 on the bottom part of the word line formation trench 14.

Next, by removing the upper part of the TiN/W deposition film using conventional dry etching, the TiN/W deposition film 17 remains on the bottom part of the word line formation trench 14, thereby forming the word line 17.

By the process step as shown in FIG. 13A to FIG. 13C, the word line 17 is formed on the bottom part of the word line formation trench 14.

In this case, there are word lines 17 that are buried word lines WL and those that are element-separating buried word lines FSWL and, although they have the same structure, their functions are different. In this case, whereas the buried word line WL is used as the gate electrode in a memory cell, the isolation word line FSWL is provided for the purpose of applying a prescribed electrical potential and separating adjacent transistors. Although the isolation between adjacent transistors generally uses a STI structure, in the semiconductor device according to the present embodiment, the isolation region 6 separates between the elements adjacent in the y direction, and the buried gate electrode separates between the elements adjacent in the x direction. In this case, because the buried word line WL of the transistor and the element-separating buried word line FSWL can be formed simultaneously, it is possible to apply a known double patterning technology, and it is known that this is a suitable structure for further nanoscaling.

Figure 14A:
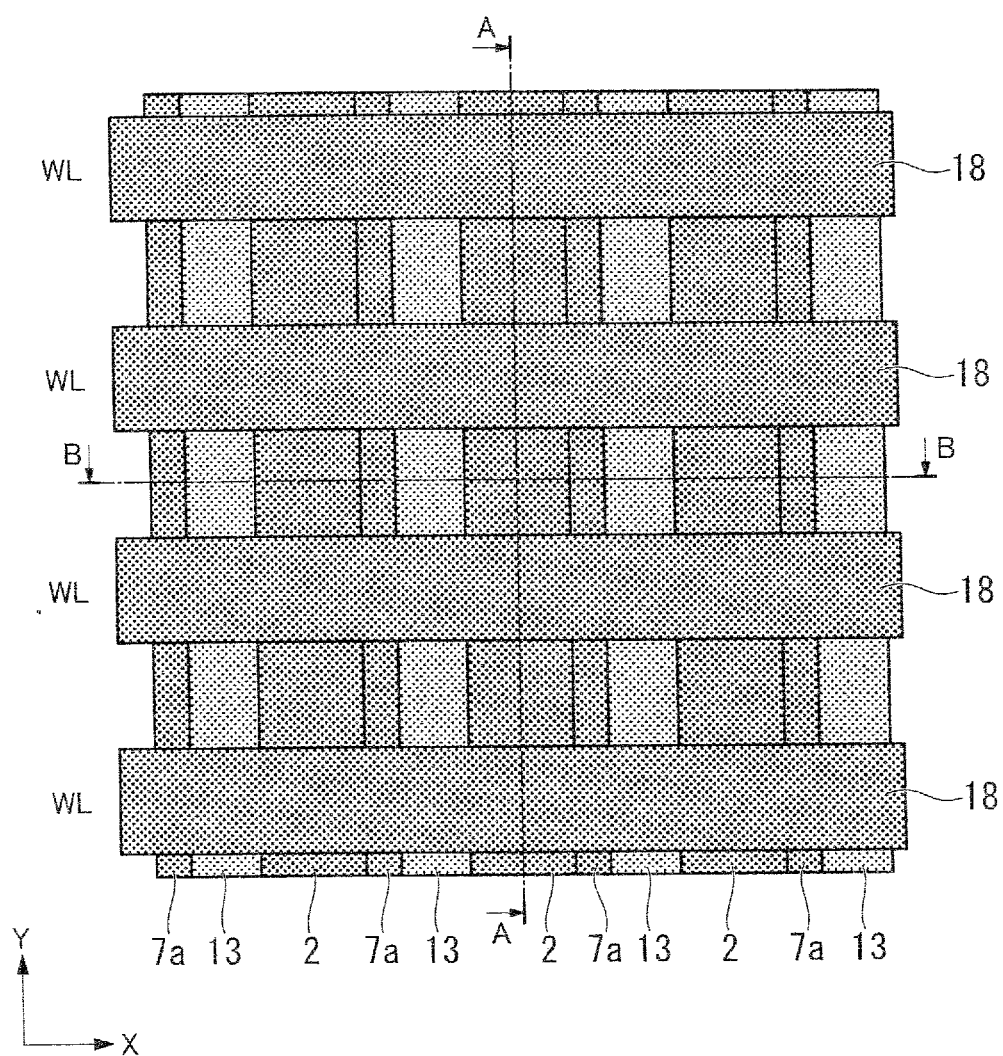
FIG. 14A is a fragmentary plain view of a step, subsequent to the step of FIGS. 13A, 13B, and 13C, involved in the method of forming the semiconductor device of FIGS. 1A, 1B and 1C, in accordance with the embodiment of the present invention.
Figure 14B:
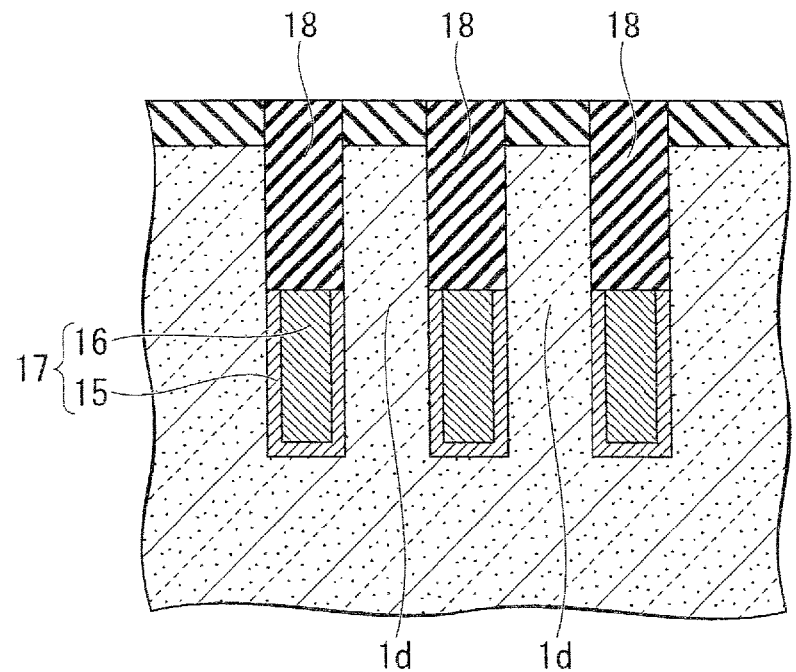
FIG. 14B is a fragmentary cross sectional elevation view, taken along an A-A line of FIG. 14A.
Figure 14C:
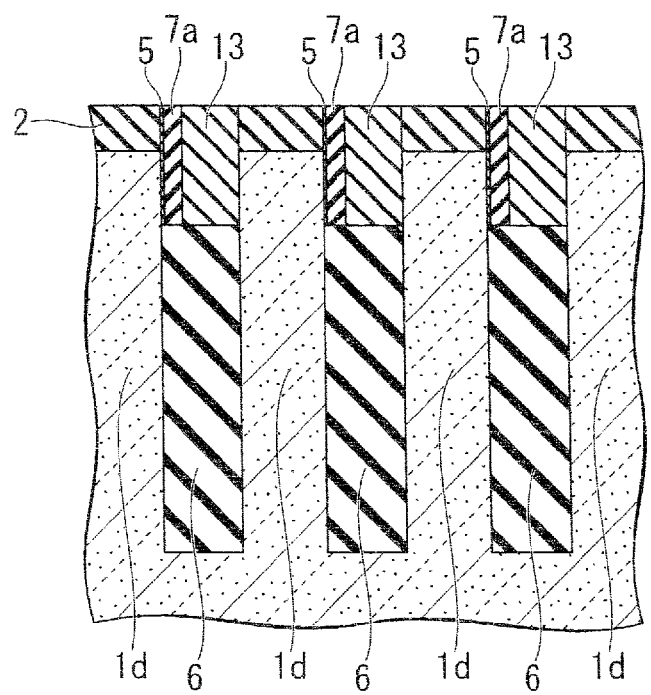
FIG. 14C is a fragmentary cross sectional elevation view, taken along a B-B line of FIG. 14A.

Next, as shown in FIGS. 14A and 14C, a sixth insulating film 18 is formed on the word line 17 within the word line formation trench (second trench) 14.

Specifically, for example, CVD is used to form the buried insulating film (sixth insulating film) 18 so as to cover above the TiN/W laminated film 17 and the inner wall of the word line formation trench 14.

Next, CMP is used to planarize the surface so that the heights of the surface of the buried insulating film (sixth insulating film) 18 and the surface of the masking insulating film 2 are made substantially the same.

The process step shown in FIG. 14A to FIG. 14C completes the formation of the buried word line.

(Bit Contact Aperture Formation Process)

Figure 15A:
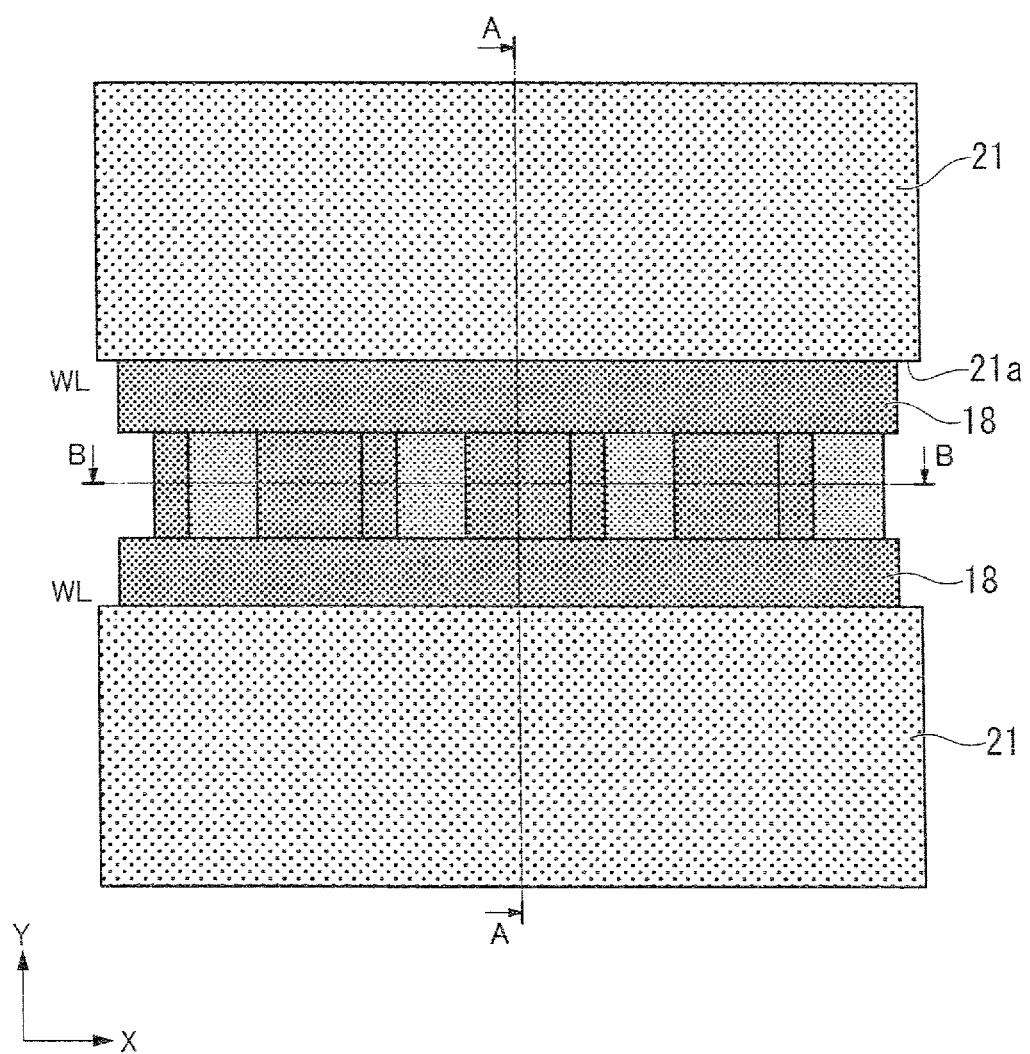
FIG. 15A is a fragmentary plain view of a step, subsequent to the step of FIGS. 14A, 14B, and 14C, involved in the method of forming the semiconductor device of FIGS. 1A, 1B and 1C, in accordance with the embodiment of the present invention.
Figure 15B:
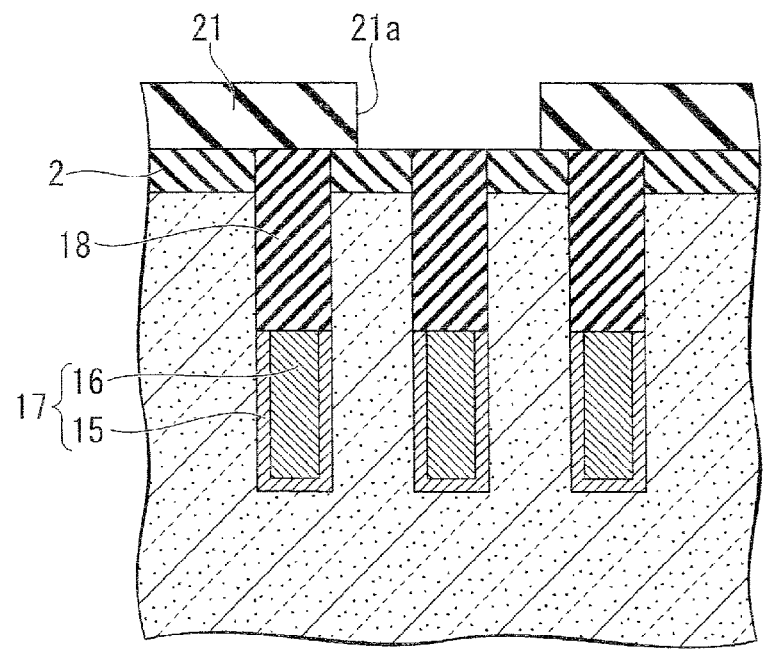
FIG. 15B is a fragmentary cross sectional elevation view, taken along an A-A line of FIG. 15A.
Figure 15C:
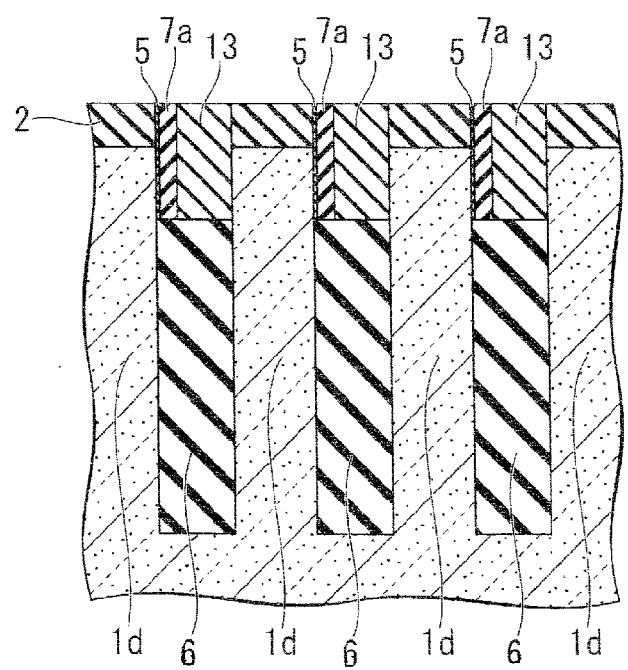
FIG. 15C is a fragmentary cross sectional elevation view, taken along a B-B line of FIG. 15A.

Next, as shown in FIG. 15A to 15C, first, in the y direction (first direction) for each prescribed number of semiconductor pillars 1d, a seventh insulating film 21 is formed over the entire surface of the plurality of the semiconductor pillars 1d arranging in the x direction (second direction). This seventh insulating film 21 having an aperture 21a in the second direction will serve as a mask for the bit contact aperture.

Specifically, for example, HDP-CVD (high-density plasma-chemical vapor deposition) is used to form the seventh insulating film 21 made of a plasma oxide film (HDP (high-density plasma) film) having a thickness of approximately 30 nm, so as to cover the entire surface. Next, photolithography and dry etching are used to remove a part of the first interlayer insulating film 21 and to form the bit contact aperture (aperture) 21a.

By the process step shown in FIG. 15A to FIG. 15C, in the isolation trench 4 the side wall 7a that is formed on the upper part side surface 1ca of the element formation region 1a with the intervening the oxide film 5 remains to form the mask having the aperture for removing the silicon oxide film (fourth insulating film) 13.

Figure 16A:
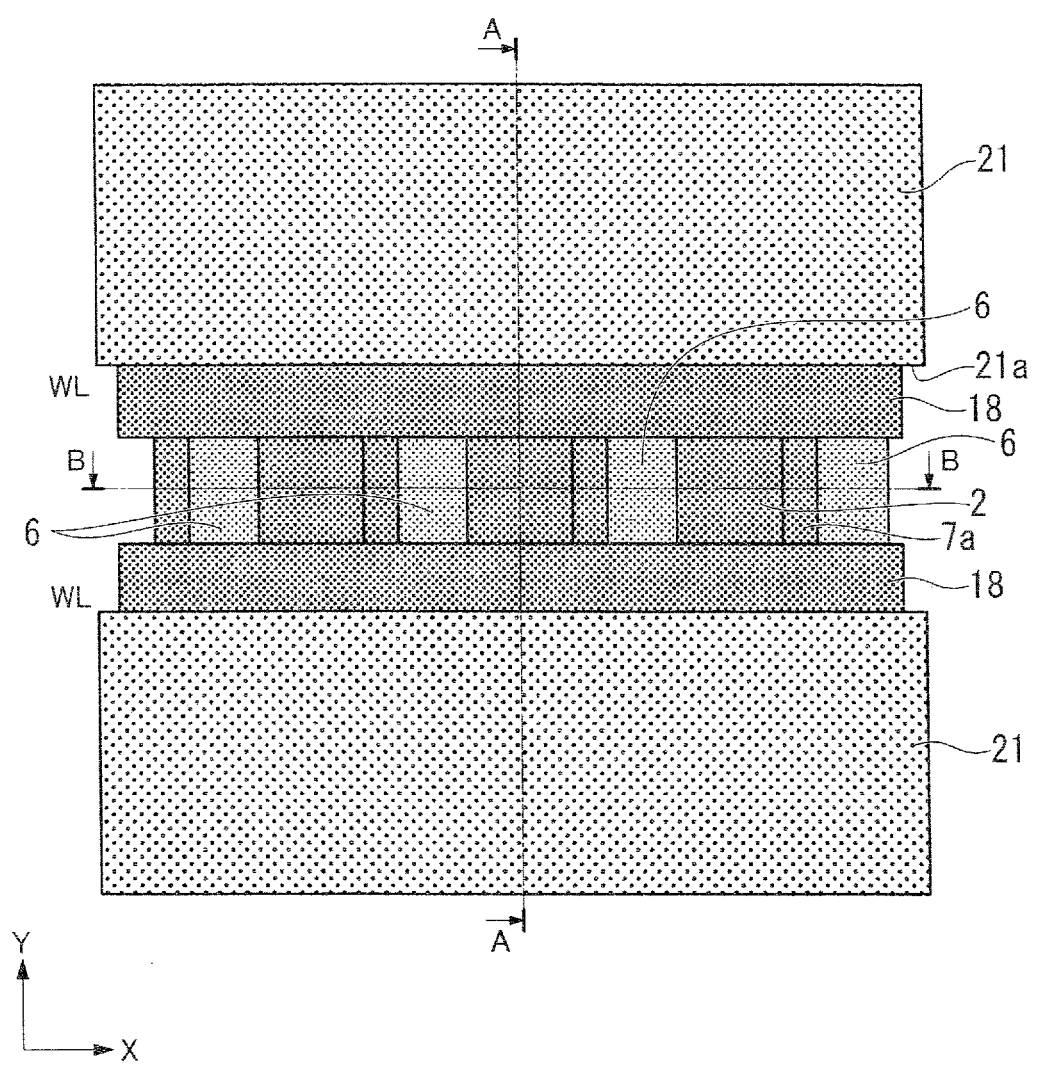
FIG. 16A is a fragmentary plain view of a step, subsequent to the step of FIGS. 15A, 15B, and 15C, involved in the method of forming the semiconductor device of FIGS. 1A, 1B and 1C, in accordance with the embodiment of the present invention.
Figure 16B:
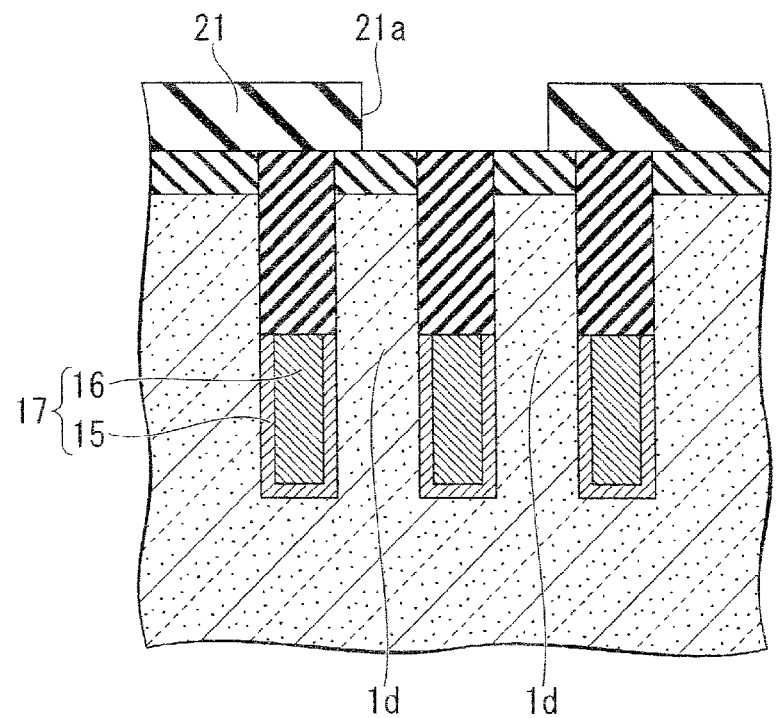
FIG. 16B is a fragmentary cross sectional elevation view, taken along an A-A line of FIG. 16A.
Figure 16C:
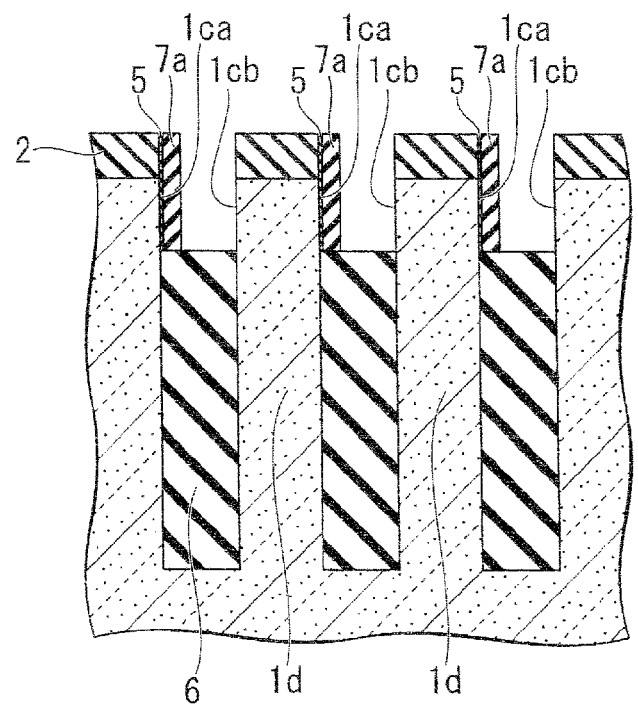
FIG. 16C is a fragmentary cross sectional elevation view, taken along a B-B line of FIG. 16A.

Next, as shown in FIG. 16A to FIG. 16C, the seventh insulating film 21 is used as a mask to perform wet etching using a solution having a higher etching speed with respect to the fourth insulating film 13 than that of the side wall (third insulating film) 7a, to remove totally the fourth insulating film 13 that is exposed by forming the bit contact aperture (aperture) 21a of the fourth insulating film 13, thereby exposing the upper part side surface 1cb, which is the side, of a pair of the upper part side surfaces 1ca and 1cb, on which the third insulating film 7a is not formed.

Specifically, for example, by performing wet etching using hydrofluoric acid (HF), which has a higher etching speed with respect to the fourth insulating film 13, which is made of a silicon oxide film, than that of the side wall (third insulating film) 7a, which is made of a silicon nitride film, the fourth insulating film 13 is selectively removed so as to expose the upper part side surface 1cb of the semiconductor pillar 1d.

By the process step shown in FIG. 16A to 16C the silicon oxide film (fourth insulating film) 13 in the isolation trench 4 is removed, thereby exposing the upper part side surface 1cb, the side wall 7a that is formed on the upper part side surface 1ca of the element formation region 1a with the intervening oxide film 5 remaining.

Figure 17A:
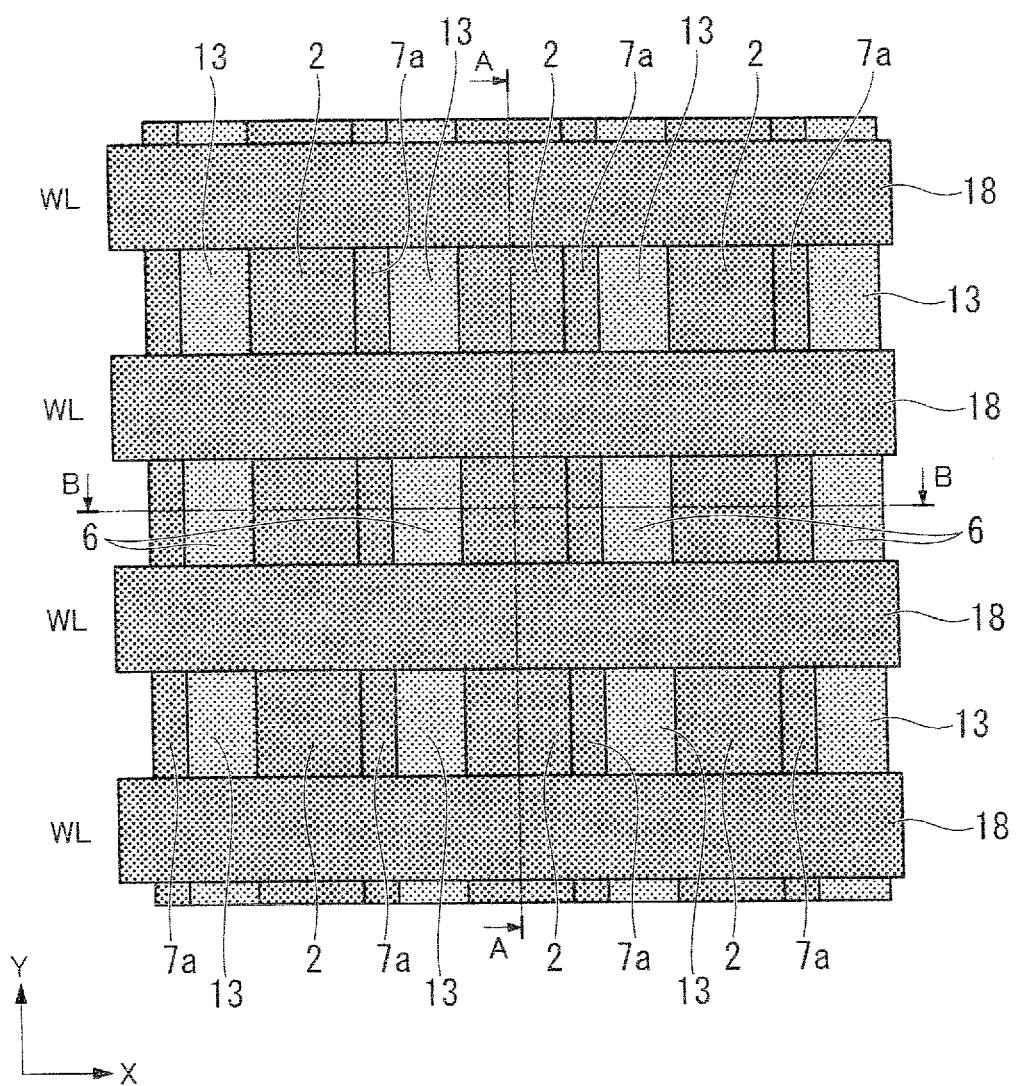
FIG. 17A is a fragmentary plain view of a step, subsequent to the step of FIGS. 16A, 16B, and 16C, involved in the method of forming the semiconductor device of FIGS. 1A, 1B and 1C, in accordance with the embodiment of the present invention.
Figure 17B:
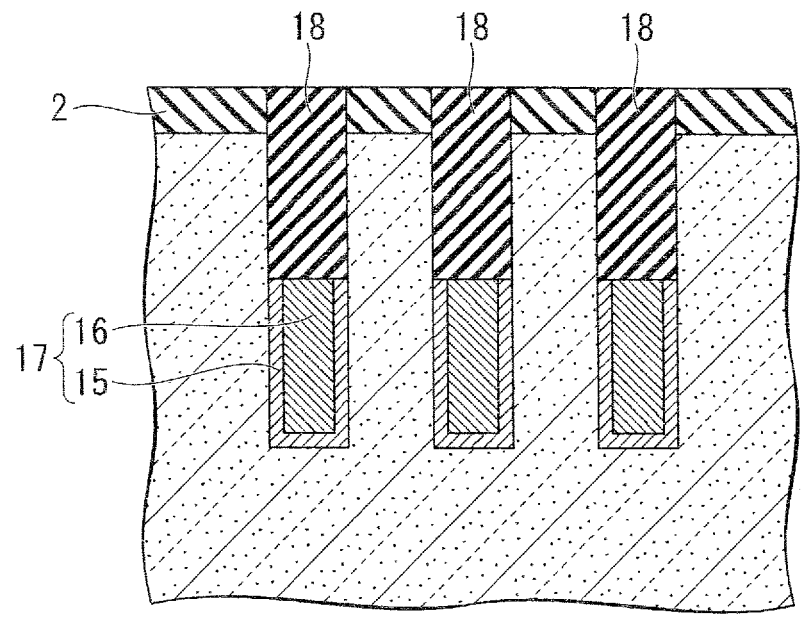
FIG. 17B is a fragmentary cross sectional elevation view, taken along an A-A line of FIG. 17A.
Figure 17C:
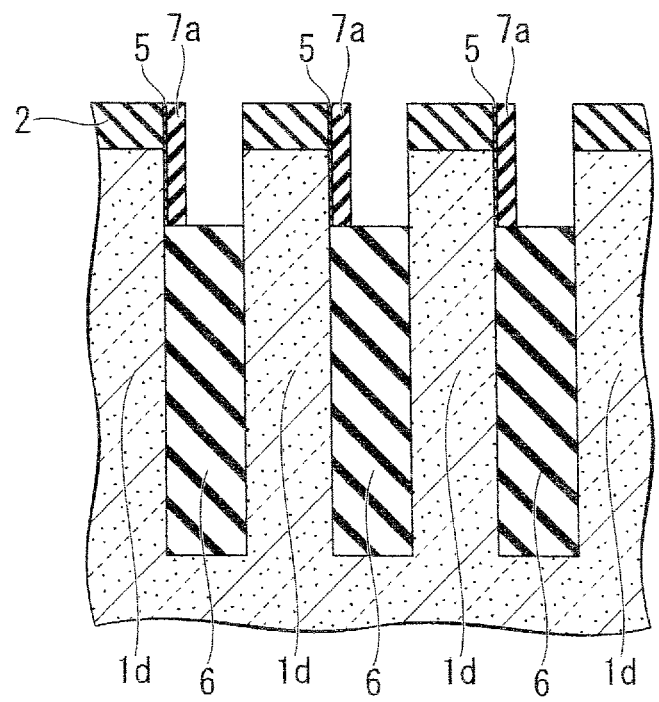
FIG. 17C is a fragmentary cross sectional elevation view, taken along a B-B line of FIG. 17A.

Next, as shown in FIG. 17A to 17C, the seventh insulating film 21 that serves as the mask for the bit contact aperture is removed.

Specifically, for example, by wet etching using hydrofluoric acid (HF), the plasma oxide film (seventh insulating film) 21 that serves as the mask for the bit contact aperture is removed.

(Bit Line Contact Formation Process)

Figure 18A:
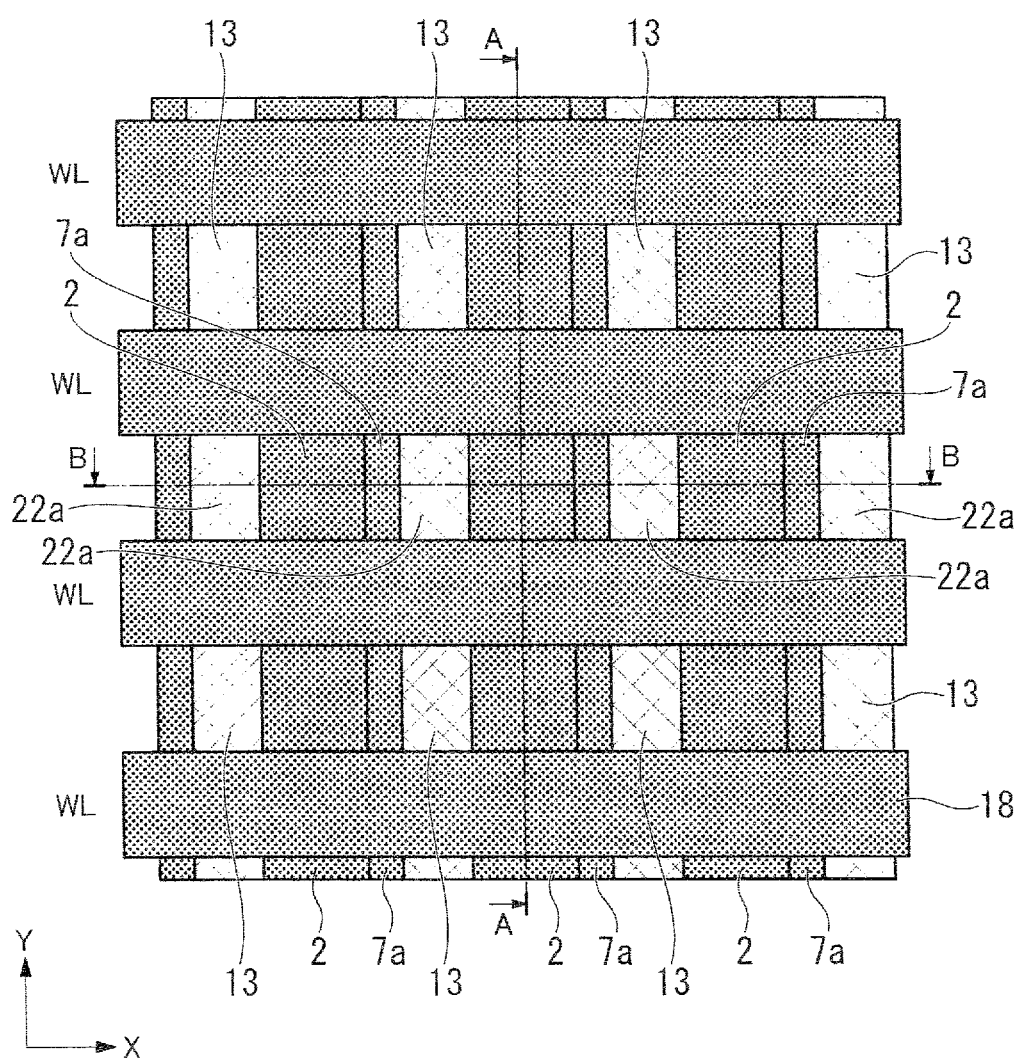
FIG. 18A is a fragmentary plain view of a step, subsequent to the step of FIGS. 17A, 17B, and 17C, involved in the method of forming the semiconductor device of FIGS. 1A, 1B and 1C, in accordance with the embodiment of the present invention.
Figure 18B:
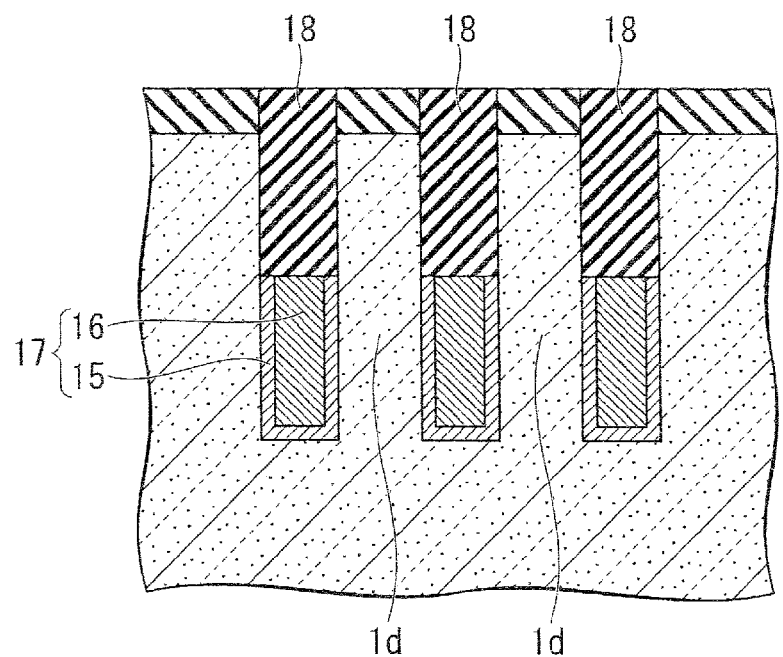
FIG. 18B is a fragmentary cross sectional elevation view, taken along an A-A line of FIG. 18A.
Figure 18C:
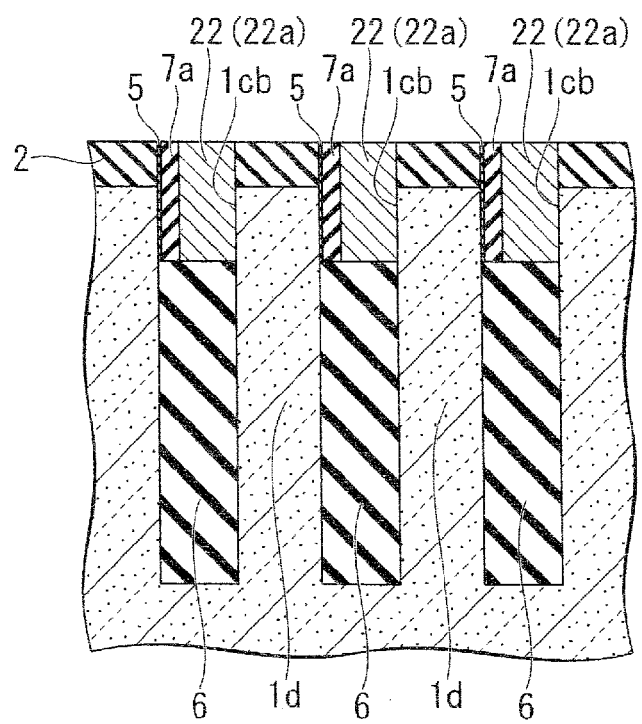
FIG. 18C is a fragmentary cross sectional elevation view, taken along a B-B line of FIG. 18A.

Next, as shown in FIG. 18A to 18C, by burying the inside of the isolation trench (first trench) 4 in which the fourth insulating film 13 is removed, a first semiconductor film 22 making contact with the exposed upper part side surface 1cb is formed, and an impurity is implanted into the first semiconductor film 22, thereby forming the bit line contact 22a.

As shown in FIG. 18A, because the fourth insulating film 13 is buried in the isolation trench 4 in which the fourth insulating film 13 has not been removed at the step shown in FIG. 16, the first semiconductor film 22 is not buried into the isolation trench 4. That is, because the semiconductor pillars 1d that, in the upper part, have the impurity diffusion region 23a connected to the bit line contact 22a are arranged at every prescribed number in the y direction (first direction), the isolation trenches 4, in which the fourth insulating films 13 are removed for forming the bit line contacts 22a, are arranged at every prescribed number in the y direction (first direction) and, regarding the isolation trenches 4 in which the other bit line contacts 22a are not formed, the fourth insulating films 13 remain without removing.

Specifically, for example, the CVD is used to deposit the silicon film (first semiconductor film) 22 which is doped with an n-type dopant such as phosphorus with the concentration of $22 \times 10^{19}/cm^3$, so that the inner part of the isolation trench 4 is filled, and the overall surface of the masking silicon nitride film (first insulating film) 2 is covered, after which etching back is done until the masking silicon nitride film (first insulating film) 2 is exposed, thereby forming the bit line contact 22a buried in the isolation trench 4.

By this processing step, the bit line contact 22a is arranged in the y direction (first direction) at every third, such as the bit line contact 22a, the silicon oxide film (fourth insulating film) 13, the silicon oxide film (fourth insulating film) 13, and the bit line contact 22a.

(Diffusion Area Formation Process)

Figure 19A:
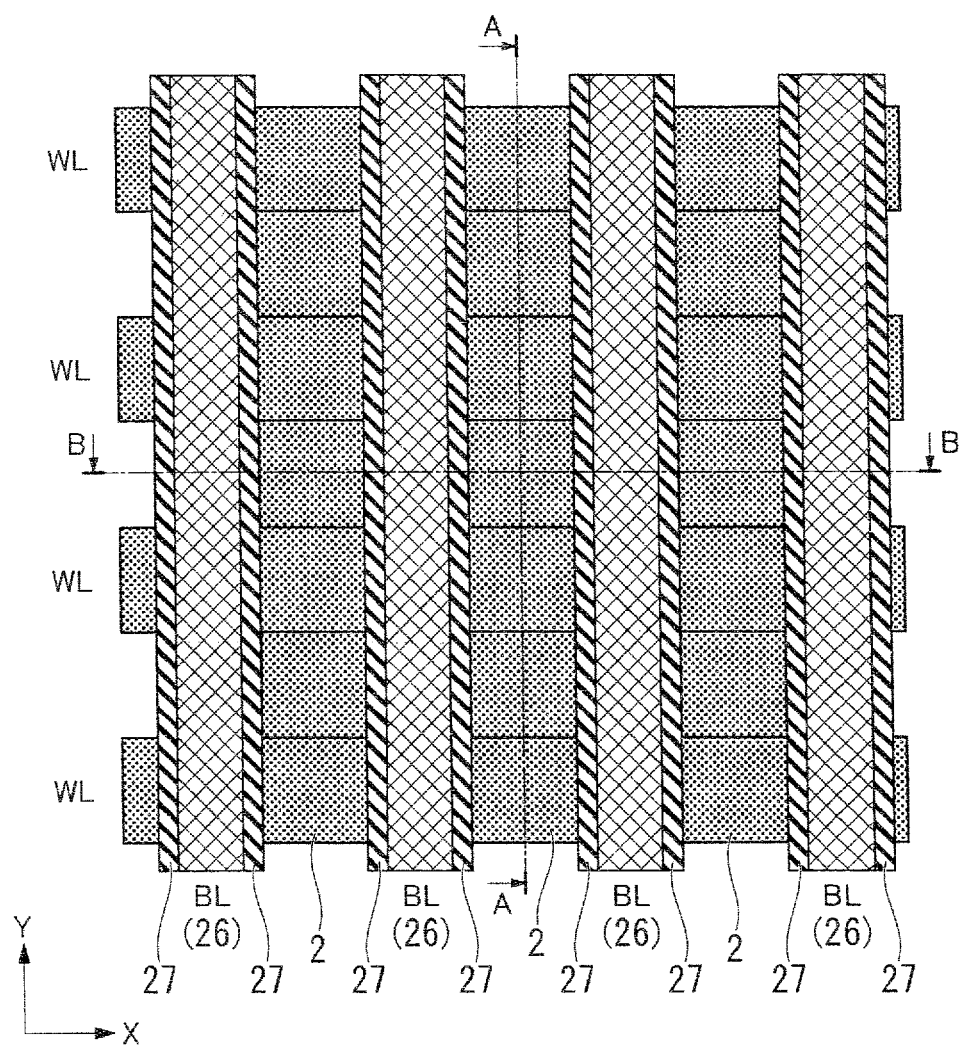
FIG. 19A is a fragmentary plain view of a step, subsequent to the step of FIGS. 18A, 18B, and 18C, involved in the method of forming the semiconductor device of FIGS. 1A, 1B and 1C, in accordance with the embodiment of the present invention.
Figure 19B:
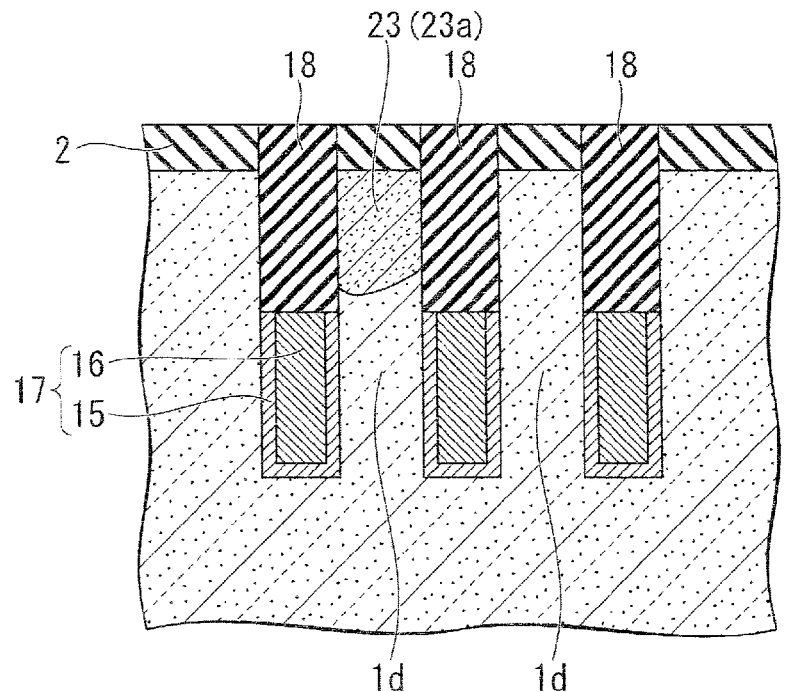
FIG. 19B is a fragmentary cross sectional elevation view, taken along an A-A line of FIG. 19A.
Figure 19C:
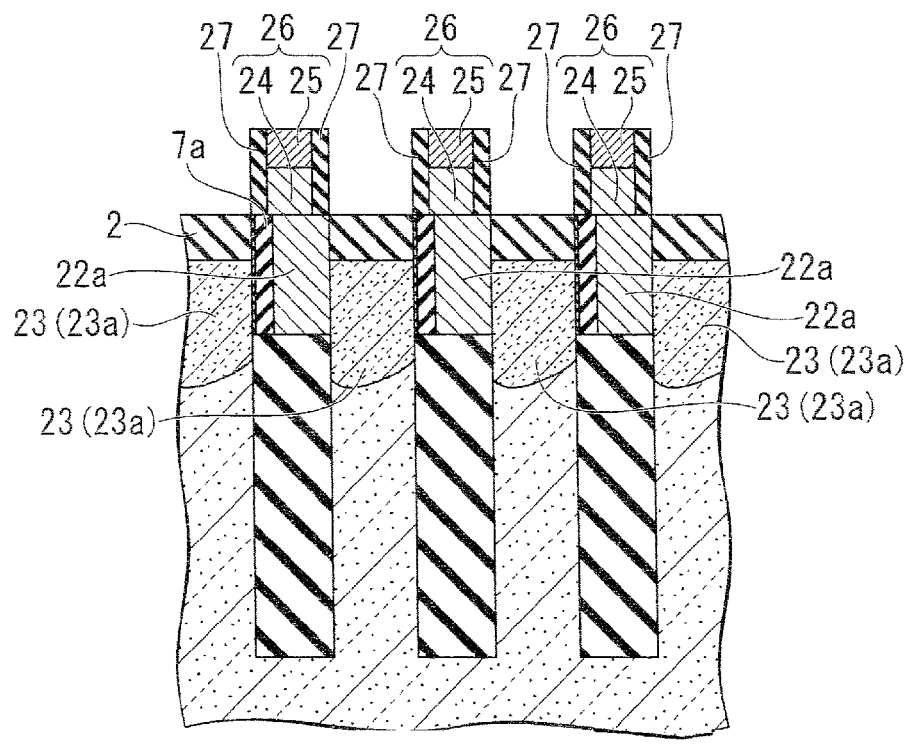
FIG. 19C is a fragmentary cross sectional elevation view, taken along a B-B line of FIG. 19A.

Next, as shown in FIG. 19A to 19C, in the above-noted bit line contact formation process, the impurity doped in the bit line contact 22a is caused to be diffused into the upper part of the semiconductor pillar 1d via the upper part side surface 1cb of the semiconductor pillar 1d, to form the impurity diffusion region 23 (23a).

Specifically, for example, using thermal diffusion the impurity doped into the bit line contact 22a is diffused into the upper part of the semiconductor pillar 1d via the upper part side surface 1cb of the semiconductor pillar 1d to form the impurity diffusion region 23 (23a).

By this process step, the impurity diffusion region 23a that is electrically connected to the bit line contact 22a is formed in the upper part of every third semiconductor pillar 1d.

(Bit Line Formation Process)

Next, as shown in FIG. 19A to 19C, the bit lines 26 extending in y direction (first direction) are formed over the bit line contacts 22a.

Specifically, for example, a polysilicon layer 24 in which an impurity is doped is formed over the entire surface of the masking silicon nitride film (first insulating film) 2, the bit line contact 22a, and the side wall (third insulating film) 7a. Also, the polysilicon layer 24 in which an impurity is doped can be caused to contain the impurity by the CVD in the deposition process. After forming the non-doped silicon film, an impurity can be imparted by ion implantation. Next, the metal film 25 is formed by the successive deposition of a tungsten nitride (WN) film and a tungsten (W) film on this impurity-doped polysilicon layer. Before forming tungsten nitride, a metal silicide film can be formed on the surface of the polysilicon layer 24. Titanium silicide, tungsten silicide, cobalt silicide, nickel silicide or the like can be used as the metal silicide film. By doing this, a bit line having lower resistance can be formed.

Next, a laminated film made of a W/WN film and a polysilicon layer is patterned in a linear shape using conventionally known lithography and dry etching, thereby, as shown in FIG. 19A and FIG. 19C, enabling the formation of the bit line 26 made of the metal film 25 and polysilicon layer 24. In the formation of the bit line 26, the alignment is adjusted at the lithography step so that the center of the bit line 26 is positioned at the center of the isolation trench (first trench) 4.

Moreover, photoresist (not shown), which will serve as a mask for processing, is subjected to a known line-thinning process for the purpose of narrowing the lines, the width of the bit line 26 being made narrower than that of the isolation trench. By doing this, it its possible to prevent the side wall edge part of the side wall insulating film 27 formed in the next step from protruding into the active region side, in which an adjacent storage node contact 30 is formed.

Next, LP-CVD is used to form the silicon nitride film so as to cover the entire surface of the bit line 26, and patterning is done to leave the silicon nitride film at only the side surface of the bit line 26, thereby forming the side wall insulating film 27 made of the silicon nitride film.

By this process step, the bit line 26 that is electrically connected to the bit line contact 22a and that is made of the metal film 25 and the polysilicon layer 24 is formed.

Although in the present embodiment the bit line 26 is formed by a laminated film made of the polysilicon layer 24 and the metal film 25 as noted above, the formation of the polysilicon layer 24 can be omitted, so as to constitute the bit line by the single metal layer 25. By this constitution, because the height of the bit line can be reduced, the storage node contact formation processing of the next process step can be simplified.

(Storage Node Contact Hole Formation Process)

Figure 20A:
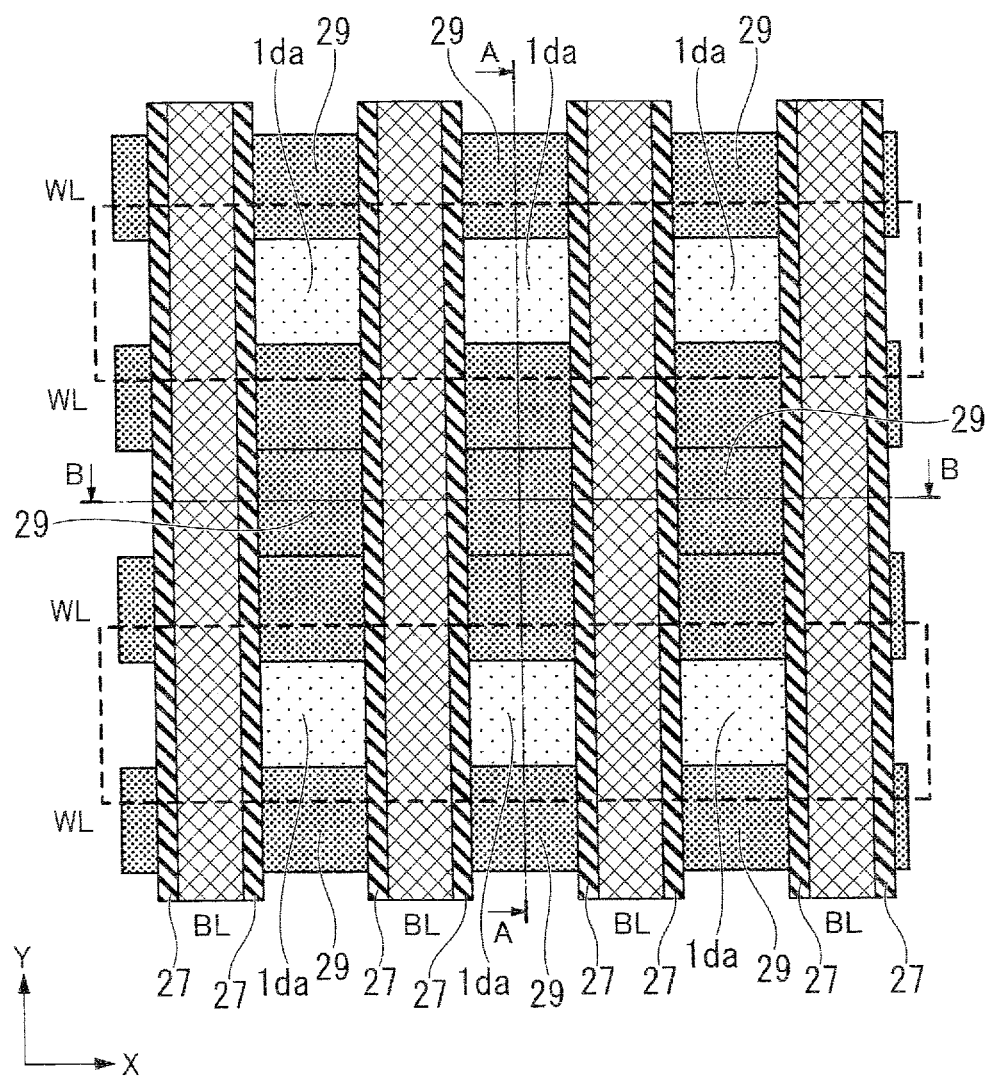
FIG. 20A is a fragmentary plain view of a step, subsequent to the step of FIGS. 19A, 19B, and 19C, involved in the method of forming the semiconductor device of FIGS. 1A, 1B and 1C, in accordance with the embodiment of the present invention.
Figure 20B:
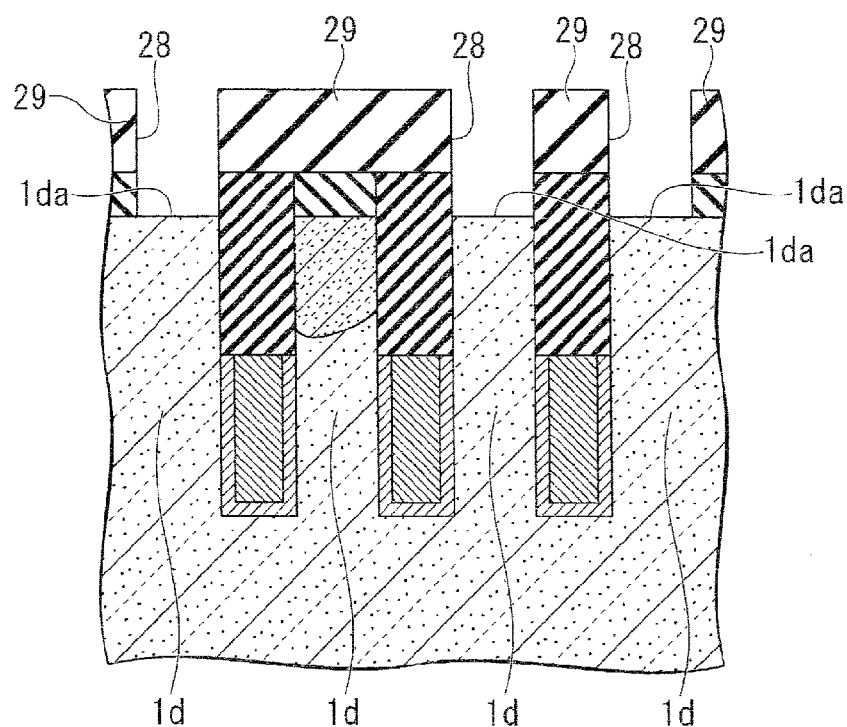
FIG. 20B is a fragmentary cross sectional elevation view, taken along an A-A line of FIG. 20A.
Figure 20C:
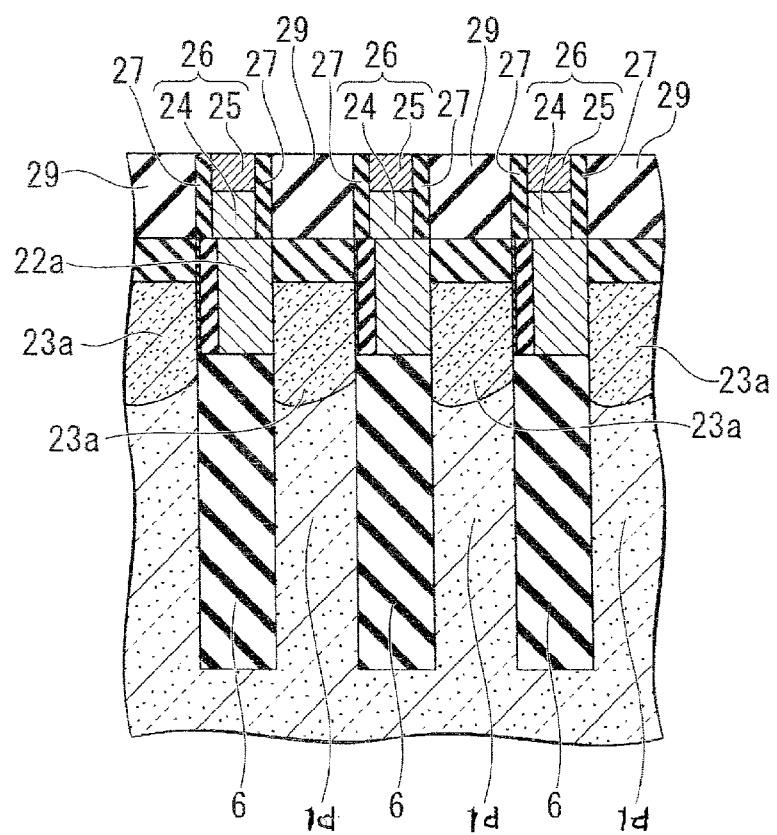
FIG. 20C is a fragmentary cross sectional elevation view, taken along a B-B line of FIG. 20A.

Next, as shown in FIG. 20A to 20C, of the semiconductor pillar 1d, the first insulating film 2 that does not make contact with the bit line contact 22a on the semiconductor pillar is removed to expose the upper surface 1da of the semiconductor pillar to form the storage node contact hole 28 on the upper surface 1da.

In the FIG. 20A to 20C, the storage node contact is formed on the semiconductor pillar 1d within the area surrounded by the dotted line, and the capacitor is formed further thereon.

Specifically, for example, after forming the insulating film 29 over the entire surface, using conventionally known lithography and dry etching, the storage node contact pattern for use as a mask is formed on the insulating film 29, and the first insulating film 2 is etched by conventional anisotropic dry etching, thereby forming the storage node contact hole 28.

By this process step, a mask having the storage node contact hole 28 for forming the storage node contact is formed.

(Impurity Diffusion Region Formation Process)

Next, as shown in FIG. 1A to FIG. 1C, using the storage node contact pattern made of the insulating film 29 as a mask, the impurity is implanted from the upper surface 1da of the exposed semiconductor pillar, thereby forming the impurity diffusion region 23b on the upper part of the semiconductor pillar 1d.

Specifically, for example, an n-type dopant such as phosphorus or the like is ion-implanted under conditions of an acceleration energy of 10 keV and a dose amount of $1 \times 10^{14}$/cm$^2$.

By this process step, the impurity diffusion region 23b is formed on the upper part of the semiconductor pillar 1d on which the storage node contact is formed.

(Storage Node Contact Formation Process)

Next, as shown in FIG. 1A to 1C, the conductive layer is filled into the storage node contact hole 28, and the storage node contact 30 is formed on the semiconductor pillar with which the bit line does not make contact.

Specifically, for example, LP-CVD is used to bury into the storage node contact hole 28 on the insulating film 29, a silicon film in which phosphorus is doped with a concentration of $22 \times 10^{19}$/cm$^3$ is made deposition to a thickness of approximately 100 nm Next, CMP is used to polish away polysilicon, thereby filling the storage node contact hole 28 to form the storage node contact 30.

By this process step, the storage node contact 30 is formed on the semiconductor pillar 1d having the impurity diffusion region 23b.

(Capacitor Formation Process)

Next, a contact pad (not shown) is formed on the storage node contact 30, a connecting lower electrode is formed, and then a capacitor insulating film and an upper electrode are formed, thereby forming the capacitor 40.

By this process step, the capacitor 40 is formed via the storage node contact 30 on the semiconductor pillar 1d having the impurity diffusion region 23b.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a first single-crystal semiconductor pillar projected from a substrate, the first single-crystal semiconductor pillar including a first top surface and a first side surface extending downwardly from the first top surface; and
   a bit contact including a topmost surface, a bottommost surface and a second side surface interfacing the topmost and bottommost surfaces with each other, a part of the second side surface of the bit contact being in direct contact with a part of the first side surface of the first single-crystal semiconductor pillar so that the first top surface of the first single-crystal semiconductor pillar is placed between the topmost and bottommost surfaces of the bit contact,
   a second single-crystal semiconductor pillar projected from the substrate apart from the first single-crystal semiconductor pillar to form a gap between the first and second single-crystal semiconductor pillars, the second single-crystal semiconductor pillar including a second top surface and a third side surface extending downwardly from the second top surface;
   a word line filling a part of the gap in isolation from each of the first and second single-crystal semiconductor pillars with a gate insulating film;
   a first diffusion region formed in an upper portion of the first single-crystal semiconductor pillar; and
   a second diffusion region formed in an upper portion of the second single-crystal semiconductor pillar,
   wherein the first diffusion region is formed more deeply than the second diffusion region.

2. The semiconductor device according to claim 1, further comprising a cap insulating film formed on the word line to fill a remaining part of the gap, the cap insulating film being formed more deeply than the bit contact.

3. The semiconductor device according to claim 1, further comprising a cap insulating film formed on the word line to fill a remaining part of the gap, the cap insulating film being formed more deeply than each of the first and second diffusion regions.

4. The semiconductor device according to claim 1, further comprising:

an insulating film formed in contact with the bottommost surface of the bit contact and with another part of the side surface of the first single-crystal semiconductor pillar.

5. The semiconductor device according to claim 1, further comprising:
an insulating film formed in contact with another part of the second side surface of the bit contact and with the first top surface of the first single-crystal semiconductor pillar.

6. The semiconductor device according to claim 1, further comprising a cap insulating film formed on the word line to fill a remaining part of the gap, the cap insulating film being in contact with the bit contact.

7. The semiconductor device according to claim 4, wherein the insulating film is elongated to cover another part of the second side surface of the bit contact.

8. The semiconductor device according to claim 1, wherein the bit contact comprises a silicon film containing an impurity.

9. The semiconductor device according to claim 1, wherein the bit contact is free from being in direct contact with the first top surface of the first single-crystal semiconductor pillar.

10. A semiconductor device, comprising:
a plurality of first single-crystal semiconductor pillars arranged in line in a first direction, each of the first single-crystal semiconductor pillars including a first top surface and a first side surface elongated downwardly from the first top surface;
a plurality of second single-crystal semiconductor pillars each provided adjacently to an associated one of first single-crystal semiconductor pillars to form a plurality of gaps each formed between adjacent ones of the first and second single-crystal semiconductor pillars, each of the second single-crystal semiconductor pillars having a second top surface and a second side surface elongated downwardly from the second top surface;
a plurality of first diffusion regions, each of the first diffusion regions being formed in an upper portion of an associated one of the first single-crystal semiconductor pillars;
a plurality of second diffusion regions, each of the second diffusion regions being formed in an upper portion of an associated one of the second single-crystal semiconductor pillars;
a plurality of word lines, each of the word lines extending in a second direction, that crosses the first direction, to fill a part of an associated one of the gaps;
an insulating film covering the first and second single-crystal semiconductor pillars and filling a remaining part of each of the gaps;
a bit line formed over the insulating film and extending in the first direction; and
a plurality of bit contacts arranged in line in the first direction, each of the bit contacts being in contact with a corresponding part of the bit line and projecting therefrom toward the insulating film to include a lower surface and a third side surface elongated upwardly from the lower surface, each of the bit contacts being connected to an associated one of the first single-crystal semiconductor pillars through a direct contact of a part of the third side surface of the bit contact with a part of the first side surface of the first single-crystal semiconductor pillar,
wherein the first diffusion region is formed more deeply than the second diffusion region.

11. The semiconductor device according to claim 10, further comprising:
a plurality of storage node contacts, each of the storage node contacts being connected to the second top surface of an associated one of the second single-crystal semiconductor pillars; and
a plurality of capacitors, each of the capacitors being coupled with an associated one of the storage node contacts.

12. The semiconductor device according to claim 10, wherein the bit contact comprises a silicon film containing an impurity.

13. The semiconductor device according to claim 10, wherein each of the bit contacts is free from being in direct contact with the first top surface of an associated one of the first single-crystal semiconductor pillars.

14. A semiconductor device comprising:
a single-crystal semiconductor substrate including a plurality of first grooves each elongated in a first direction and a plurality of second grooves each elongated in a second direction, that crosses the first direction, to define in the single-crystal semiconductor substrate a plurality of sets of single-crystal semiconductor pillars, each of the sets of single-crystal semiconductor pillars including a first single-crystal semiconductor pillar and a second single-crystal semiconductor pillar sandwiching a portion of an associated one of the first grooves, each of the first and second single-crystal semiconductor pillars including a first top surface and a first side surface extending downwardly from the first top surface;
an insulating film covering each of the sets of single-crystal semiconductor pillars and filling each of the first and second grooves;
a plurality of bit contacts including a topmost surface and a second side surface extending downwardly from the topmost surface, each of the bit contacts being buried in a first portion of the insulating film, that fills an associated one of the second grooves, with the topmost surface being exposed from the insulating film and with a part of the second side surface being in direct contact with a part of the first side surface of the first single-crystal semiconductor pillar of an associated one of the sets of single-crystal semiconductor pillars;
a plurality of bit lines each formed on the insulating film and extending in the second direction in contact with the top surface of each of corresponding ones of the bit contacts;
a plurality of word lines each extending in the first direction and embedded into a second portion of the insulating film, that fills an associated one of the first grooves, with being isolated from each of the first and second single-crystal semiconductor pillars; and
a plurality of first diffusion regions each formed in an upper portion of the first single-crystal semiconductor pillar of an associated one of the sets of single-crystal semiconductor pillars; and a plurality of second diffusion regions each formed in an upper portion of the second single-crystal semiconductor pillar of an associated one of the sets of single-crystal semiconductor pillars,
wherein each of the first diffusion regions contains the part of the first side surface of the first single-crystal semiconductor pillar of an associated one of the sets of single-crystal semiconductor pillars, and
wherein each of the first diffusion regions is deeper than each of the second diffusion regions.

15. The semiconductor device according to claim 14, wherein the bit contact comprises a silicon film containing an impurity.

16. The semiconductor device according to claim 14, wherein each of the bit contacts is free from being in contact with the first top surface of the first single-crystal semiconductor pillar of an associated one of the sets of single-crystal semiconductor pillars.

* * * * *